(12) United States Patent
Noguchi et al.

(10) Patent No.: US 10,211,043 B2
(45) Date of Patent: Feb. 19, 2019

(54) STACKED FILM, ELECTRONIC DEVICE SUBSTRATE, ELECTRONIC DEVICE, AND METHOD OF FABRICATING STACKED FILM

(71) Applicant: TDK CORPORATION, Tokyo (JP)

(72) Inventors: Takao Noguchi, Tokyo (JP); Yoshihiko Yano, Tokyo (JP)

(73) Assignee: TDK CORPORATION, Tokyo (JP)

( * ) Notice: Subject to any disclaimer, the term of this patent is extended or adjusted under 35 U.S.C. 154(b) by 26 days.

(21) Appl. No.: 15/599,930

(22) Filed: May 19, 2017

(65) Prior Publication Data

US 2017/0345718 A1 Nov. 30, 2017

(30) Foreign Application Priority Data

May 24, 2016 (JP) .................. 2016-103587

(51) Int. Cl.

| | |
|---|---|
| *H01L 21/70* | (2006.01) |
| *H01L 21/82* | (2006.01) |
| *H01L 27/02* | (2006.01) |
| *H01L 27/06* | (2006.01) |
| *H01L 27/12* | (2006.01) |
| *H01L 21/02* | (2006.01) |
| *H01L 21/822* | (2006.01) |
| *H01L 29/51* | (2006.01) |
| *H01L 41/08* | (2006.01) |

(Continued)

(52) U.S. Cl.
CPC ...... *H01L 21/02189* (2013.01); *H01L 21/707* (2013.01); *H01L 21/822* (2013.01); *H01L 21/8221* (2013.01); *H01L 27/0211* (2013.01); *H01L 27/06* (2013.01); *H01L 27/0688* (2013.01); *H01L 27/12* (2013.01); *H01L 29/513* (2013.01); *H01L 41/0815* (2013.01); *H01L 41/319* (2013.01); *H01H 2057/006* (2013.01); *H01L 28/55* (2013.01); *H01L 28/65* (2013.01)

(58) Field of Classification Search
CPC ... H01L 41/0815; H01L 41/187; H01L 41/27; H01L 41/319; H01L 21/02189; H01L 29/513; H01L 27/12; H01L 27/0211; H01L 27/0688; H01L 27/06; H01L 21/8221; H01L 21/822; H01L 21/707
See application file for complete search history.

(56) References Cited

U.S. PATENT DOCUMENTS

| | | | |
|---|---|---|---|
| 5,753,934 A | 5/1998 | Yano et al. | |
| 5,801,105 A | 9/1998 | Yano et al. | |
| | (Continued) | | |

FOREIGN PATENT DOCUMENTS

| | | |
|---|---|---|
| JP | H9-110592 A | 4/1997 |
| JP | 2015-154015 A | 8/2015 |

*Primary Examiner* — Tom Thomas
*Assistant Examiner* — Benjamin T Liu
(74) *Attorney, Agent, or Firm* — Oliff PLC

(57) ABSTRACT

A stacked film is a stacked film including an oxide film, and a metal film provided on the oxide film, in which the oxide film includes a $ZrO_2$ film of which a main surface is a (001) plane, the metal film includes a Pt film or a Pd film that has a single orientation and of which a main surface is a (001) plane, and a [100] axis of the $ZrO_2$ film and a [100] axis of the metal film are parallel to an interface between the oxide film and the metal film, and the axes of both are parallel to each other.

7 Claims, 16 Drawing Sheets

(51) Int. Cl.
*H01L 41/319* (2013.01)
*H01L 49/02* (2006.01)
*H01H 57/00* (2006.01)

(56) References Cited

U.S. PATENT DOCUMENTS

2013/0240874 A1* 9/2013 Maekawa ......... H01L 29/66136
                                                          257/43
2015/0236244 A1* 8/2015 Kijima ................ H01L 41/0815
                                                          428/446
2017/0158571 A1* 6/2017 Kijima ................. C04B 41/009

* cited by examiner

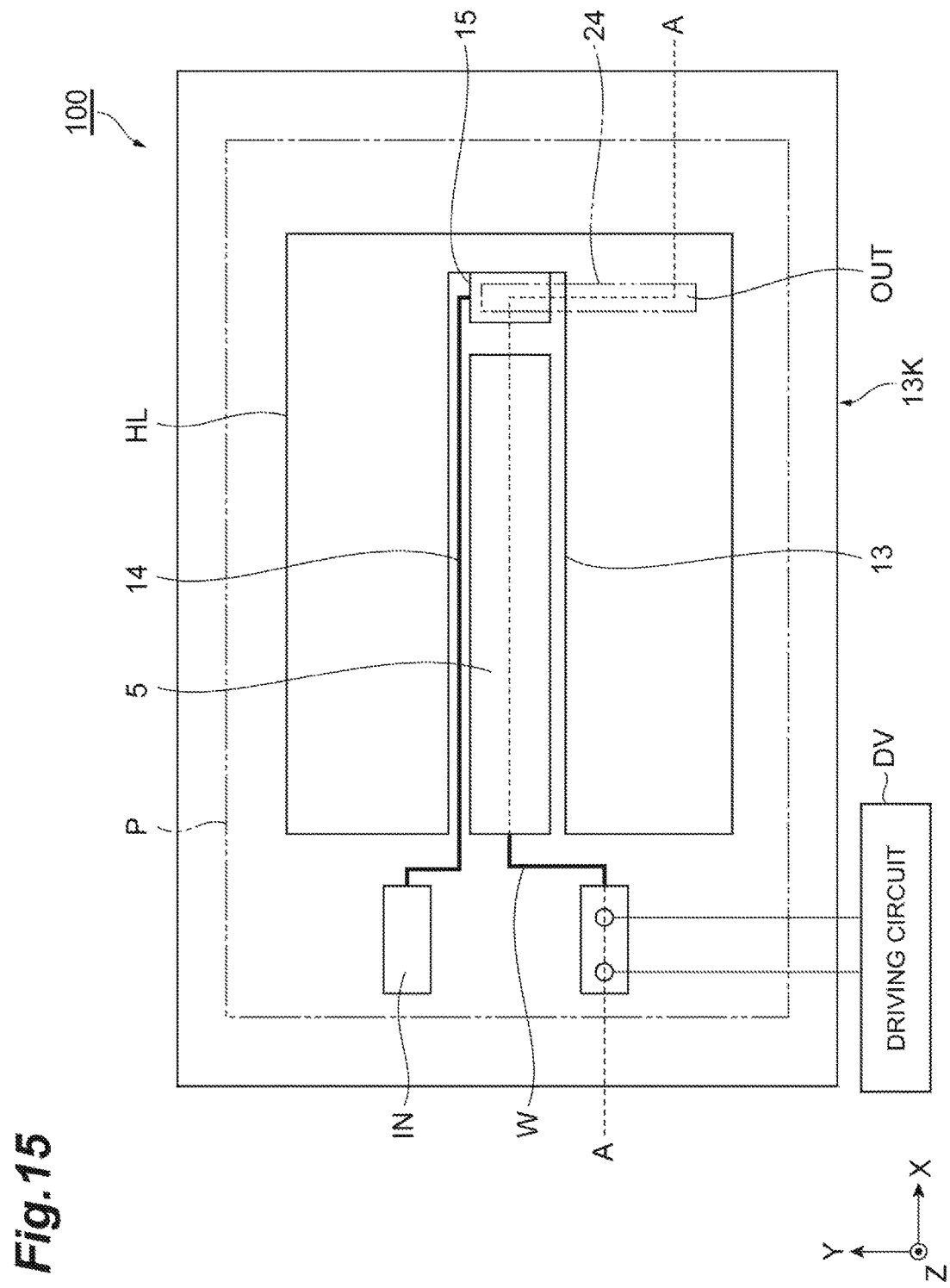

Pt UNIT LATTICE

ZrO2 UNIT LATTICE

STACKED FILM, ELECTRONIC DEVICE SUBSTRATE, ELECTRONIC DEVICE, AND METHOD OF FABRICATING STACKED FILM

TECHNICAL FIELD

The present invention relates to a stacked film, an electronic device substrate, an electronic device, and a method of fabricating a stacked film.

BACKGROUND

A piezoelectric element has attracted attention as applications such as an actuator for a magnetic head or an MEMS switch. Particularly, a thin film piezoelectric element has high position accuracy and is operable as a high speed actuator (Patent Document 1: Japanese Unexamined Patent Application Publication No. Hei 09-110592). A structure in which a $ZrO_2$ film is deposited on a Si substrate and a Pt film is deposited on the $ZrO_2$ film has been proposed as a stacked film used for a thin film piezoelectric element (Patent Document 1).

Further, a structure in which a $ZrO_2$ film and an $Y_2O_3$ film are deposited on a Si substrate, and a Pt film is deposited via a $PtO_2$ film has been proposed (Patent Document 2: Japanese Unexamined Patent Application Publication No. 2015-154015).

SUMMARY

However, in a metal film such as the Pt film obtained in this case, orientation and uniformity of a crystal (hereinafter referred to as "crystallinity") are low, and even when a piezoelectric film is formed on the metal film, crystallinity of the piezoelectric film is low and piezoelectric characteristics are not sufficient. When a metal film having a single orientation, a wide area, and uniformity can be used, a piezoelectric film with high crystallinity can be efficiently formed on the metal film.

The present invention has been made in view of such problems, and an object thereof is to provide a stacked film including a metal film having a single orientation, an electronic device substrate and an electronic device using the same, and a method of fabricating the stacked film.

To solve the above-described problems, a stacked film according to a first aspect is a stacked film including an oxide film and a metal film provided on the oxide film, wherein the oxide film includes a $ZrO_2$ film of which a main surface is a (001) plane, the metal film includes a Pt film or a Pd film that has a single orientation and of which a main surface is a (001) plane, and the [100] axis of the $ZrO_2$ film and the axis of the metal film are parallel to an interface between the oxide film and the metal film, and the axes of both are parallel to each other.

This stacked film has a structure in which crystallinity of the metal film is improved. Further, in a stacked film according to a second aspect, an axis shifted by about 9.2° from a [001] axis of the $ZrO_2$ film is parallel to a [001] axis of the metal film. The crystallinity of the metal film can be improved by such a structure.

In the stacked film according to a third aspect, the oxide film includes a first oxide film including the $ZrO_2$ film; and a second oxide film including a metal oxide film containing a metal contained in the metal film and interposed between the first oxide film and the metal film.

In the case of this stacked film, due to the second oxide film (metal oxide film), the second oxide film functions as a buffer in crystal growth, resulting in a structure in which the crystallinity of the metal film is improved.

In the stacked film according to a fourth aspect, the first oxide film includes the $ZrO_2$ film; and an $Y_2O_3$ film interposed between the $ZrO_2$ film and the second oxide film.

The stacked film according to the fifth aspect further includes a piezoelectric film provided on the metal film.

In an electronic device substrate, the stacked film is provided on a wafer having a size equal to or greater than 6 inches. That is, when a stacked film is formed on a wafer with a large diameter, mass productivity is excellent.

In an electronic device, a potential application terminal for applying a potential is electrically connected to the metal film of the stacked film. A potential necessary for driving the electronic device is applied to the metal film of the stacked film, which can contribute to an operation of the electronic device.

Further, a method of fabricating any one of the above-described stacked films includes steps of: forming the oxide film including a $ZrO_2$ film; and forming the predetermined metal film containing Pt or Pd on the oxide film in a state in which supply of oxygen into a chamber is stopped.

According to this fabrication method, the above-described stacked film can be easily fabricated.

Since the stacked film of the present invention includes the metal film having a single orientation, crystallinity of the piezoelectric film or the like formed on the metal film is improved, and therefore excellent characteristics such as an increase in driving force due to the piezoelectric film or a reduction in leakage current can be exhibited.

BRIEF DESCRIPTION OF THE DRAWINGS

FIG. 15 is a plan view of a fabricated MEMS switch.

DETAILED DESCRIPTION

Figure 1:
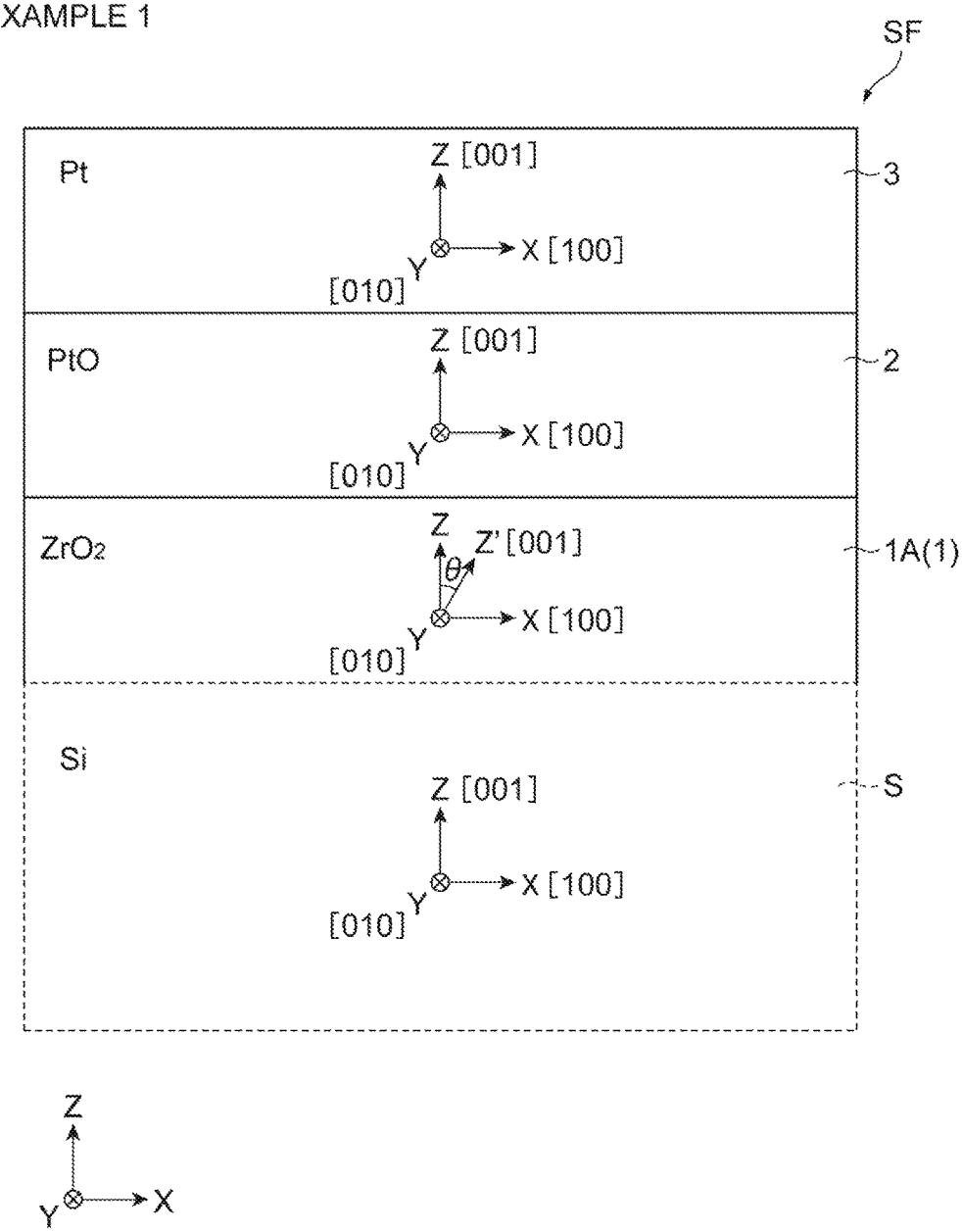
FIG. 1 is a view illustrating a longitudinal cross-sectional structure of a stacked film according to Example 1.

Hereinafter, a stacked film according to an embodiment will be described. The same reference numerals are used for the same elements, and repeated descriptions will be omitted.

FIG. 1 is a view illustrating a longitudinal cross-sectional structure of a stacked film according to Example 1. In the following description, an XYZ orthogonal coordinate system is set. A thickness direction of a Pt film as a predetermined metal film for improving crystallinity is defined as a Z axis, and axes perpendicular to the Z axis are defined as an X axis and a Y axis. For crystal axes, a c axis is defined as [001], a direction of the X axis is defined as [100], and a direction of the Y axis is defined as [010]. In the case of cubic crystal such as Si or Pt, the c axis [001] coincides with the Z axis, whereas a c axis [001] of $ZrO_2$ of a monoclinic crystal coincides with a Z' axis slightly shifted from the Z axis (θ=about 9.2°). θ=about 9.2° means that 8.2°≤θ≤10.2° at room temperature of 300 K.

Example 1

This stacked film is obtained by sequentially forming an oxide film 1, a metal oxide film 2, and a predetermined metal film 3 (a Pt film in this example) on a substrate S. A material of the substrate S is Si, the oxide film 1 includes a $ZrO_2$ film 1A, and the metal oxide film 2 (a second oxide film) provided on the oxide film 1 (a first oxide film) is a PtO film. Here, the predetermined metal film 3 (Pt film) has a single orientation and is excellent in crystallinity. As a material of the substrate S, germanium (Ge), gallium arsenide (GaAs), sapphire ($Al_2O_3$), gallium oxide ($Ga_2O_3$), gallium nitride (GaN), or the like can be used as long as $ZrO_2$ is grown as a crystal.

The $ZrO_2$ film is a film containing $ZrO_2$ as a main component, and can contain Y or Hf as another component or can contain a lanthanoid rare earth metal element such as La, Ce, or Dy. The PtO film is a film containing PtO as a main component, and the Pt film is a film containing Pt as a main component. Of course, these films can be allowed to contain impurities.

Figure 16A:
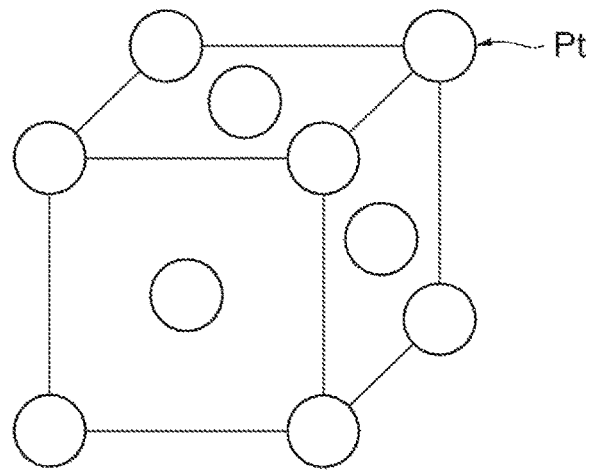
FIG. 16A and FIG. 16B are diagrams illustrating a unit lattice of Pt and $ZrO_2$.
Figure 16B:
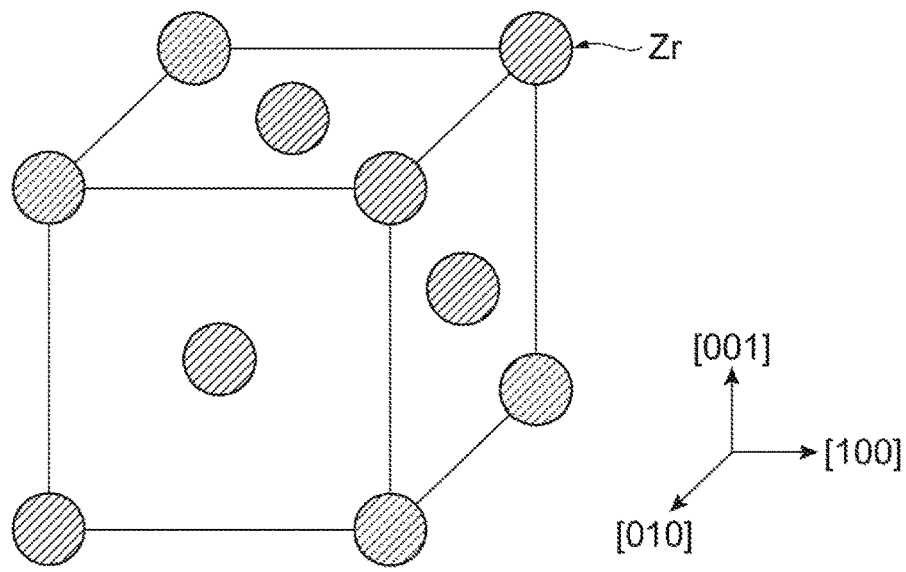

An orientation of the respective layers in a film thickness direction is Si (001)/$ZrO_2$ (001)/PtO (001)/Pt (001). In other words, directions of the c axis [001] of all of the films substantially coincide, and are parallel to a film thickness direction. Further, the orientation of the respective layers in a plane of the film is a Si (100)/$ZrO_2$ (100)/PtO (100)/Pt (100). In other words, the directions of the a axis [100] of all the films coincide and are parallel to an in-plane direction. FIG. 16A and FIG. 16B illustrates (a) a Pt unit lattice and (b) a $ZrO_2$ unit lattice (oxygen atoms are omitted). Each constituent element is located at a vertex of the lattice and is also located at a center of each plane.

This stacked film can be fabricated as follows.

First, a (001) Si substrate having a diameter of 6 inches (150 mm) is prepared as the substrate S. Then, the oxide film 1 (the $ZrO_2$ film), the metal oxide film 2 (PtO film), and the predetermined metal film 3 (Pt film) are sequentially formed on the substrate S. A forming method is as follows.

(Fabrication Conditions)

(1) Formation of the $ZrO_2$ film: A solid source material of $ZrO_2$ was prepared as a target material, a substrate temperature T1 was set to 700° C., and deposition of the $ZrO_2$ film was performed on a substrate in an argon atmosphere using a sputtering method.

(2) Formation of the PtO film: A solid source material of Pt was prepared as a target material, a substrate temperature T2 was set to 450° C., and deposition of the PtO film was performed on the $ZrO_2$ film using a sputtering method in a mixed atmosphere of argon and oxygen. The amount of supply of oxygen was 0.01 Pa when converted into pressure P1 near a substrate surface (1 mm from the surface).

(3) Formation of the Pt film: A solid source material of Pt was prepared, and the Pt film was deposited on the PtO film using a sputtering method at 500° C. in a vacuum state in which the oxygen supply was stopped without taking the substrate out of a chamber used at the time of formation of the PtO film.

(Evaluation and Results)

The Pt film was evaluated using an X-ray diffraction method. In this case, a peak having a half value width of 0.3° was observed at a position of 2θ=46.4° and other peaks had intensity equal to or smaller than 1/100. Further, it was confirmed that results of X-ray diffraction were the same in a substrate plane, and the film was uniform. This was an excellent value in comparison with a comparative example that will be described below. Accordingly, it was found that in a (001) Pt film of which an exposed surface was a (001) plane, a crystal state of the (100) plane of a face-centered cubic structure was high and constituent atoms oriented in a [100] direction were aligned. Thus, in the stacked film having the structure of Example 1, crystallinity of the Pt film was improved.

A preferable range of each of the parameters T1, T2, and P1 is as follows.

500° C.≤T1≤1000° C.
400° C.≤T2≤500° C.
0.005 Pa≤P1≤0.1 Pa

When T1 satisfies the range condition, there is an effect that the crystallinity of the $ZrO_2$ film is improved.

When T2 satisfies the range condition, there is an effect that a PtO film having high crystallinity that does not contain Pt, $PtO_2$, or the like can be obtained.

When P1 satisfies the range condition, there is an effect that a PtO film having high crystallinity that does not contain Pt, $PtO_2$, or the like can be obtained.

Figure 2:
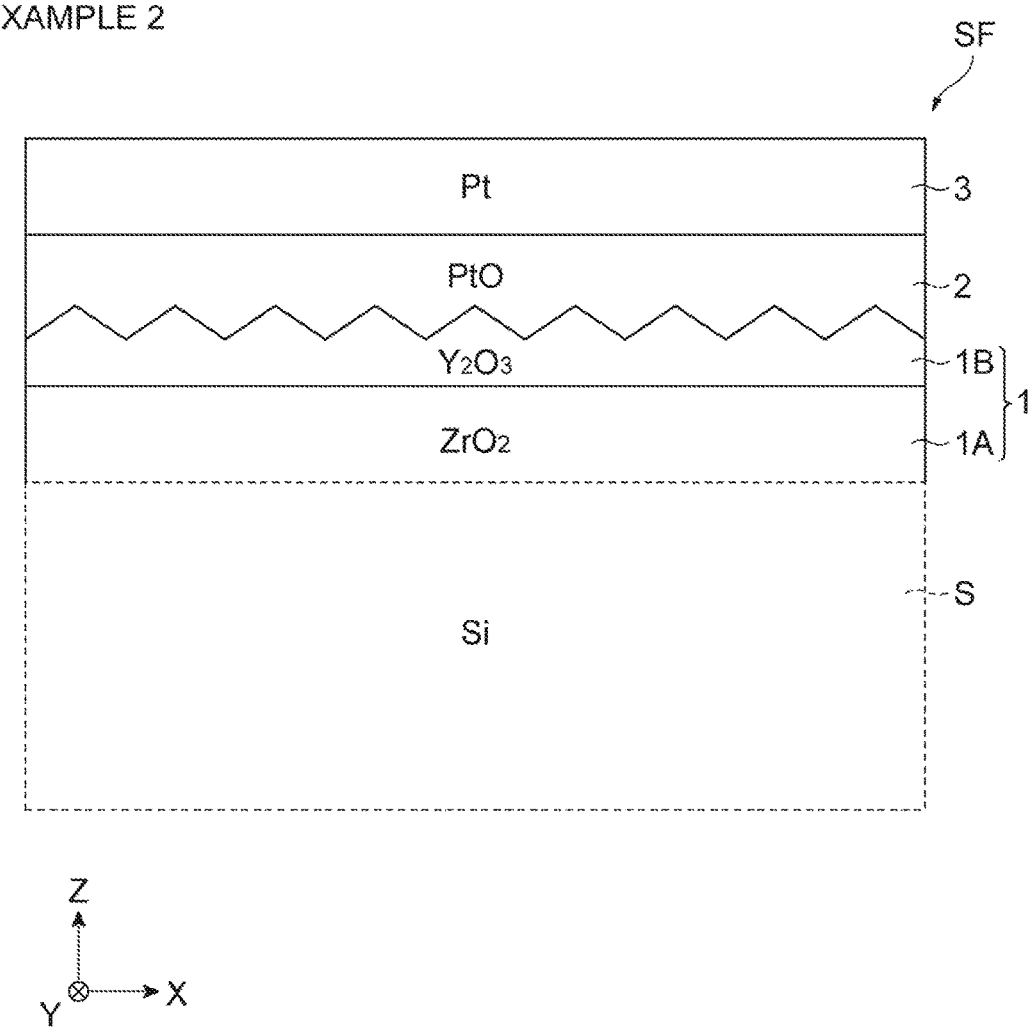
FIG. 2 is a view illustrating a longitudinal cross-sectional structure of a stacked film according to Example 2.

FIG. 2 is a view illustrating a longitudinal cross-sectional structure of the stacked film according to Example 2.

Example 2

This stacked film is obtained by sequentially forming an oxide film 1, a metal oxide film 2, and a predetermined metal film 3 on a substrate S. Si is used as a material of the substrate S, the metal oxide film 2 provided on the oxide film 1 is a PtO film, and the predetermined metal film 3 is a Pt film. Example 2 is different from Example 1 only in that the oxide film 1 includes a $ZrO_2$ film 1A and an $Y_2O_3$ film 1B, and is the same as Example 1 in other respects. In this case, the Pt film has a single orientation and is excellent in crystallinity.

An orientation of the respective layers in a film thickness direction is Si (001)/$ZrO_2$ (001)/$Y_2O_3$ (001)/PtO (001)/Pt (001). In other words, directions of the c axis [001] of all of the films substantially coincide, and are parallel to a film thickness direction. Further, the orientation of the respective layers in a plane of the film is Si (100)/ZrO$_2$ (100)/Y$_2$O$_3$ (100)/PtO (100)/Pt (100). In other words, the directions of the a axis [100] of all the films coincide and are parallel to an in-plane direction.

This stacked film can be fabricated as follows.

First, a (001) Si substrate having a diameter of 8 inches (200 mm) was prepared as the substrate S. Then, the oxide film 1 (the ZrO$_2$ film and the Y$_2$O$_3$ film), the metal oxide film 2 (PtO film), and the predetermined metal film 3 (Pt film) are sequentially formed on the substrate S. A forming method is as follows.

(Fabrication Conditions)

(1A) Formation of the ZrO$_2$ film: A solid source material of ZrO$_2$ was prepared as a target material, the substrate temperature T1 was set to 700° C., and deposition of the ZrO$_2$ film was performed on a substrate in an argon atmosphere using a sputtering method.

(1B) Formation of the Y$_2$O$_3$ film: A solid source material of Y$_2$O$_3$ was prepared as a target material, a substrate temperature T1' was set to 700° C., and deposition of the Y$_2$O$_3$ film was performed on the ZrO$_2$ film in an argon atmosphere using a sputtering method.

(2) Formation of the PtO film: A solid source material of Pt was prepared as a target material, a substrate temperature T2 was set to 450° C., and deposition of the PtO film was performed on the Y$_2$O$_3$ film using a sputtering method in a mixed atmosphere of argon and oxygen. The amount of supply of oxygen was 0.01 Pa when converted into pressure P1 near a substrate surface (1 mm from the surface).

(3) Formation of the Pt film: A solid source material of Pt was prepared, and the Pt film was deposited on the PtO film using a sputtering method at 400° C. in a vacuum state in which the oxygen supply was stopped without taking the substrate out of a chamber used at the time of formation of the PtO film.

(Evaluation and Results)

The Pt film was evaluated using an X-ray diffraction method. In this case, a peak having a half value width of 0.2° was observed at a position of 2θ=46.4° and no other peaks were observed. Further, it was confirmed that results of X-ray diffraction were the same in a substrate plane, and the film was uniform. This was an excellent value in comparison with a comparative example that will be described below and even in comparison with Example 1. It was found that in a (001) Pt film of which an exposed surface was a (001) plane, a crystal state of the (100) plane of a face-centered cubic structure was high and constituent atoms oriented in a [100] direction were aligned. Thus, in the stacked film having the structure of Example 2, crystallinity of the Pt film was improved.

A preferable range of each of the parameters T1, T1', T2, and P1 is as follows.

500° C.≤T1≤1000° C.
500° C.≤T1'≤1000° C.
400° C.≤T2≤500° C.
0.005 Pa≤P1≤0.1 Pa

When T1 satisfies the range condition, there is an effect that the crystallinity of the ZrO$_2$ film is improved.

When T1' satisfies the range condition, there is an effect that the crystallinity of the Y$_2$O$_3$ film is improved.

When T2 satisfies the range condition, there is an effect that a PtO film having high crystallinity that does not contain Pt, PtO$_2$, or the like can be obtained.

When P1 satisfies the range condition, there is an effect that a PtO film having high crystallinity that does not contain Pt, PtO$_2$, or the like can be obtained.

In Example 2, the oxide film 1 includes a ZrO$_2$ film 1A, and an Y$_2$O$_3$ film 1B interposed between the ZrO$_2$ film 1A and the metal oxide film 2. In this case, a surface of the Y$_2$O$_3$ film 1B has an uneven surface at the time of crystal growth (a plurality of small pyramid structures appear on the surface). A defect at the time of growth of the metal oxide film 2 using this uneven surface as a starting point is reduced, and a surface crystal state of the metal oxide film 2 is improved. Therefore, it is conceivable that when the predetermined metal film 3 is formed on the metal oxide film 2, a Pt film with high crystallinity is obtained. An average value AVR (Z1) of a distance in the Z-axis direction between an apex of the uneven surface and the deepest portion of a bottom surface satisfies 2 nm≤AVR (Z1)≤50 nm. This is because, if AVR (Z1) is below a lower limit, a reduction in the defect of the metal oxide film 2 is incomplete and crystallinity of the Pt film formed on an upper surface thereof is deteriorated, and if AVR (Z1) exceeds an upper limit, surface flatness of the Pt film formed on the metal oxide film is deteriorated.

Figure 3:
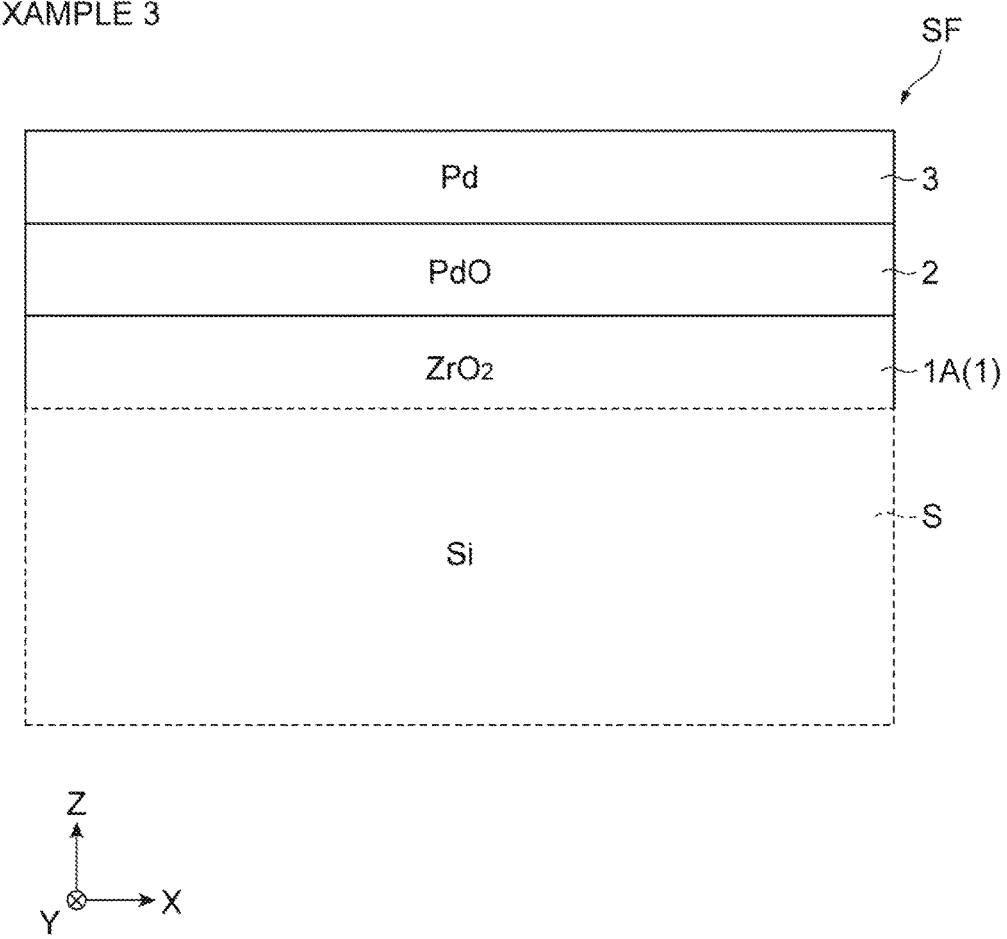
FIG. 3 is a view illustrating a longitudinal cross-sectional structure of a stacked film according to Example 3.

FIG. 3 is a view illustrating a longitudinal cross-sectional structure of a stacked film according to Example 3.

Example 3

Example 3 is different from Example 1 in that PdO is used in place of PtO as the metal oxide film 2, and a Pd film is formed on the metal oxide film 2, and is the same as Example 1 in other respects. Therefore, only formation of (2) the PdO film and (3) the Pd film will be described. A method of forming the PdO film is as follows.

(2) Formation of the PdO film: A solid source material of Pd was prepared as a target material, a substrate temperature T2' was set to 400° C., and deposition of the PdO film was performed on the ZrO$_2$ film using a sputtering method in a mixed atmosphere of argon and oxygen. The amount of supply of oxygen was 0.05 Pa when converted into pressure P1' near a substrate surface (1 mm from the surface).

(3) Formation of the Pd film: A solid source material of Pd was prepared, and the Pd film was deposited on the PdO film at 350° C. using a deposition method in a vacuum state in which the oxygen supply was stopped without taking the substrate out of a chamber used at the time of formation of the PdO film.

An orientation of the respective layers in a film thickness direction is Si (001)/ZrO$_2$ (001)/PdO (001)/Pd (001). In other words, directions of the c axis [001] of all of the films substantially coincide, and are parallel to a film thickness direction. Further, the orientation of the respective layers in a plane of the film is Si (100)/ZrO$_2$ (100)/PdO (100)/Pd (100). In other words, the directions of the a axis [100] of all the films coincide and are parallel to an in-plane direction.

(Evaluation and Results)

The Pd film was evaluated using an X-ray diffraction method. In this case, a peak with a half value width of 0.3° was observed at a position of 2θ=46.7°, and other peaks had intensity equal to or smaller than 1/100. Further, it was confirmed that results of X-ray diffraction were the same in a substrate plane and the film was uniform. This was an excellent value in comparison with a comparative example that will be described below. Accordingly, it is found that in a (001) Pd film of which an exposed surface was a (001) plane, a crystal state of a (100) plane of the face-centered cubic structure was high, and constituent atoms oriented in a [100] direction were aligned. Thus, in the stacked film having the structure of Example 3, crystallinity of the Pd film was improved.

A preferable range of each of the parameters T1, T2', and P1' is as follows.

500° C.≤T1≤1000° C.
300° C.≤T2'≤500° C.
0.005 Pa≤P1'≤0.1 Pa

When T1 satisfies the range condition, there is an effect that the crystallinity of the $ZrO_2$ film is improved.

When T2' satisfies the range condition, there is an effect that a PdO film having high crystallinity that does not contain Pd, $PdO_2$, or the like can be obtained.

When P1' satisfies the range condition, there is an effect that a PdO film having high crystallinity that does not contain Pd, $PdO_2$, or the like can be obtained.

Figure 4:
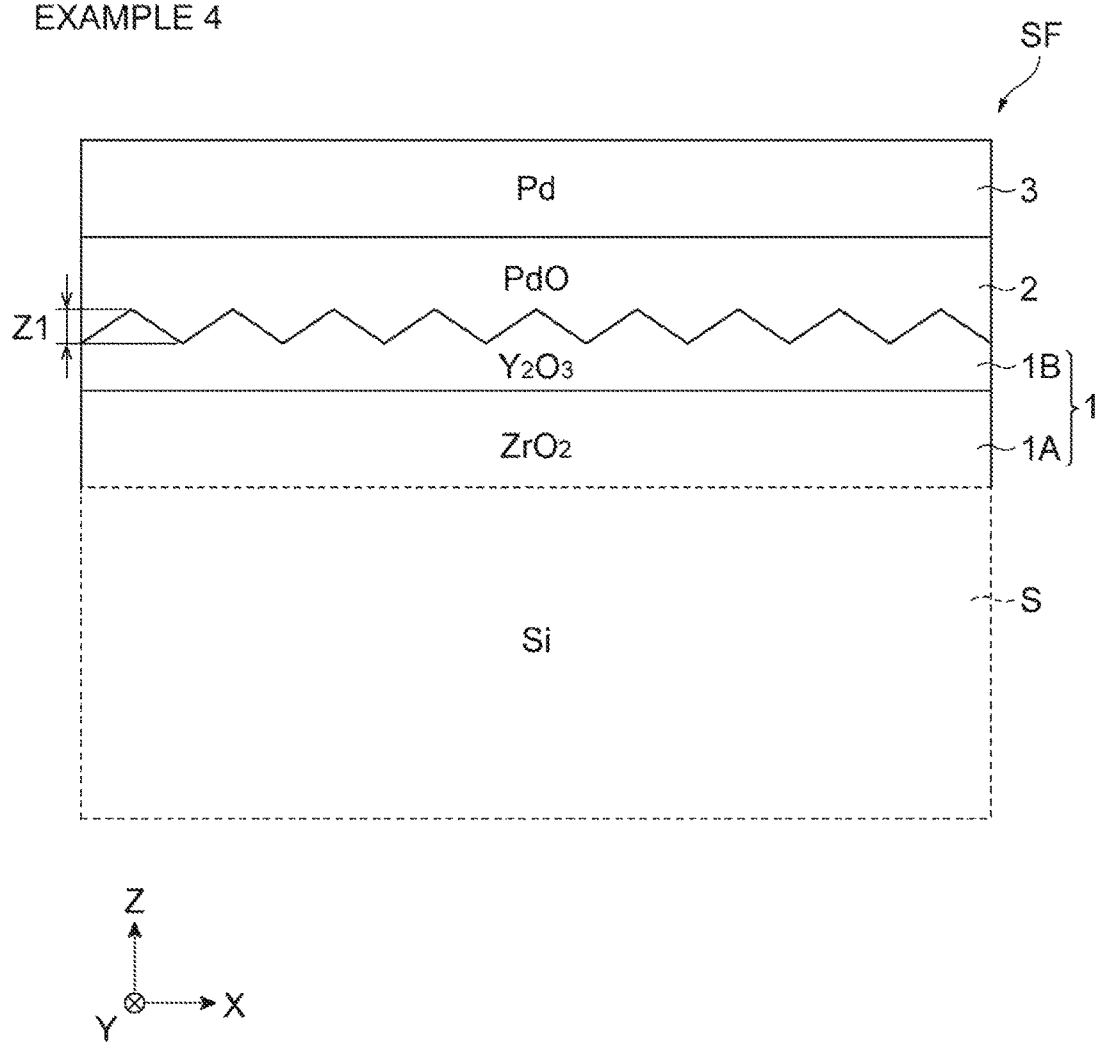
FIG. 4 is a view illustrating a longitudinal cross-sectional structure of a stacked film according to Example 4.

FIG. 4 is a view illustrating a longitudinal cross-sectional structure of the stacked film according to Example 4.

Example 4

Example 4 is different from Example 2 in that PdO is used in place of PtO as the metal oxide film 2 and Pd is used in place of Pt, and is the same as Example 2 in other respects. Therefore, to describe only the formation of the PdO film and the Pd film, a method of forming the PdO film and the Pd film is as described in Example 3.

An orientation of the respective layers in a film thickness direction is Si (001)/$ZrO_2$ (001)/$Y_2O_3$ (001)/PdO (001)/Pd (001). In other words, directions of the c axis [001] of all of the films substantially coincide, and are parallel to a film thickness direction. Further, the orientation of the respective layers in a plane of the film is Si (100)/$ZrO_2$ (100)/$Y_2O_3$ (100)/PdO (100)/Pd (100). In other words, the directions of the a axis [100] of all the films coincide and are parallel to an in-plane direction.

(Evaluation and Results)

The Pt film was evaluated using an X-ray diffraction method. In this case, a peak having a half value width of 0.2° was observed at a position of 2θ=46.7° and no other peaks were observed. Further, it was confirmed that results of X-ray diffraction were the same in a substrate plane, and the film was uniform. This was an excellent value in comparison with a comparative example that will be described below and even in comparison with Example 3. Accordingly, it was found that in the (001) Pd film of which an exposed surface was a (001) plane, a crystal state of the (100) plane of a face-centered cubic structure was high and constituent atoms oriented in a [100] direction were aligned. Thus, in the stacked film having the structure of Example 4, crystallinity of the Pd film was improved.

A preferable range of each of the parameters T1, T1', T2', and P1' is as follows.

500° C.≤T1≤1000° C.
500° C.≤T1'≤1000° C.
300° C.≤T2'≤500° C.
0.005 Pa≤P1'≤0.1 Pa

When T1 satisfies the range condition, there is an effect that the crystallinity of the $ZrO_2$ film is improved.

When T1' satisfies the range condition, there is an effect that the crystallinity of the $Y_2O_3$ film is improved.

When T2' satisfies the range condition, there is an effect that a PdO film having high crystallinity that does not contain Pd, $PdO_2$, or the like can be obtained.

When P1' satisfies the range condition, there is an effect that a PdO film having high crystallinity that does not contain Pd, $PdO_2$, or the like can be obtained.

Next, an example of a case in which the PdO film is not included in Examples 5 to 8 will be described.

Example 5

Figure 5:
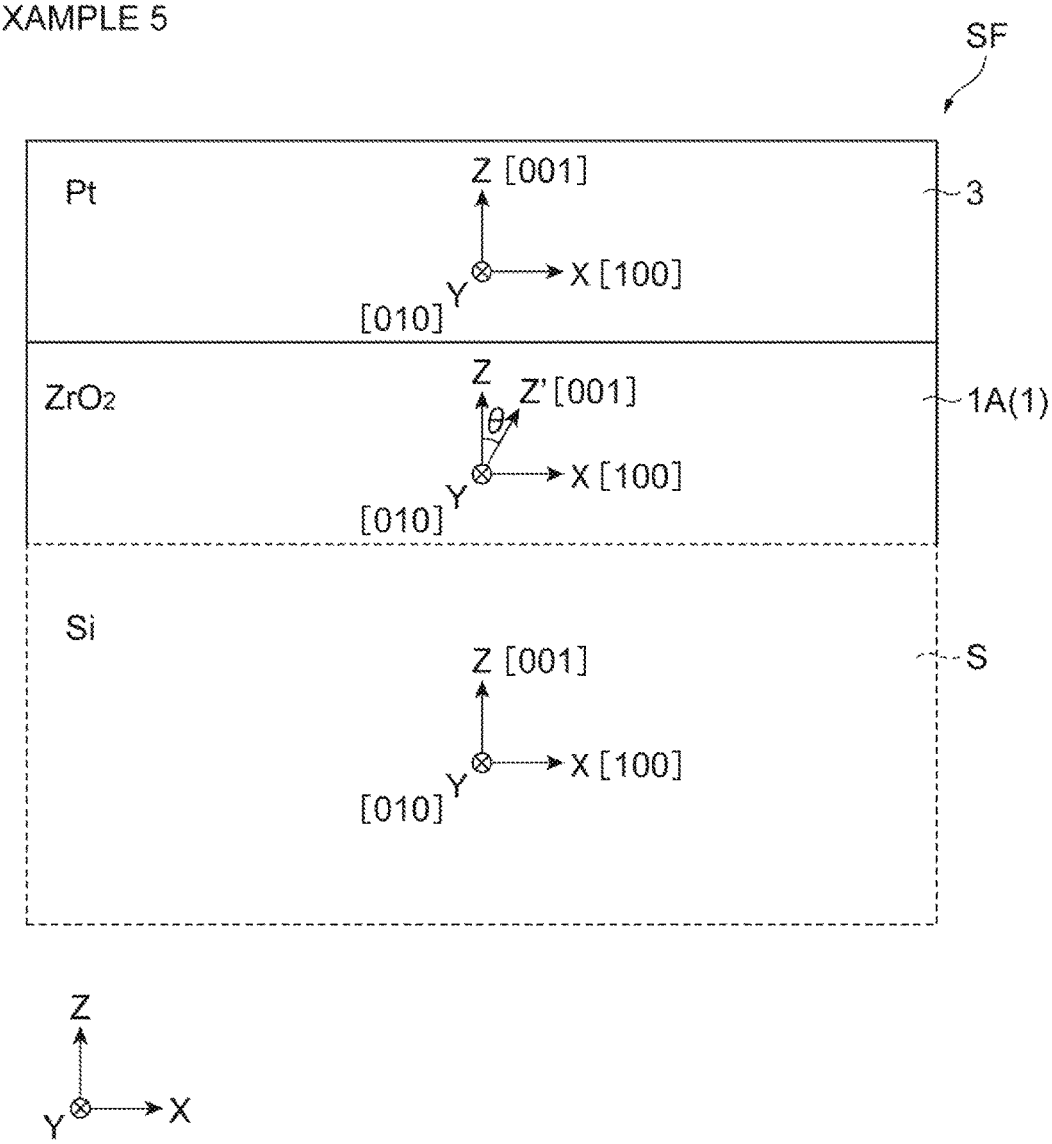
FIG. 5 is a view illustrating a longitudinal cross-sectional structure of a stacked film according to Example 5.

FIG. 5 is a view illustrating a longitudinal cross-sectional structure of the stacked film according to Example 5.

Example 5 differs from Example 1 in that PtO is removed, and is the same as in Example 1 in other respects. In this case, the Pt film 3 is formed directly on the $ZrO_2$ film 1A.

An orientation of the respective layers in a film thickness direction is Si (001)/$ZrO_2$ (001)/Pt (001). In other words, directions of the c axis [001] of all of the films substantially coincide, and are parallel to a film thickness direction. Further, the orientation of the respective layers in a plane of the film is Si (100)/$ZrO_2$ (100)/Pt (100). In other words, the directions of the a axis [100] of all the films coincide and are parallel to an in-plane direction.

(Evaluation and Results)

The Pt film was evaluated using an X-ray diffraction method. In this case, a peak having a half value width of 0.4° was observed at a position of 2θ=46.4° and no other peaks were observed. Further, it was confirmed that results of X-ray diffraction were the same in a substrate plane, and the film was uniform. This was an excellent value in comparison with a comparative example that will be described below. Accordingly, it was found that in a (001) Pt film of which an exposed surface was a (001) plane, a crystal state of the (100) plane of a face-centered cubic structure was high and constituent atoms oriented in a [100] direction were aligned. Thus, in the stacked film having the structure of Example 5, crystallinity of the Pt film was improved.

A preferred range of the parameter T1 is the same as that in Example 1, and the same effects are achieved.

Example 6

Figure 6:
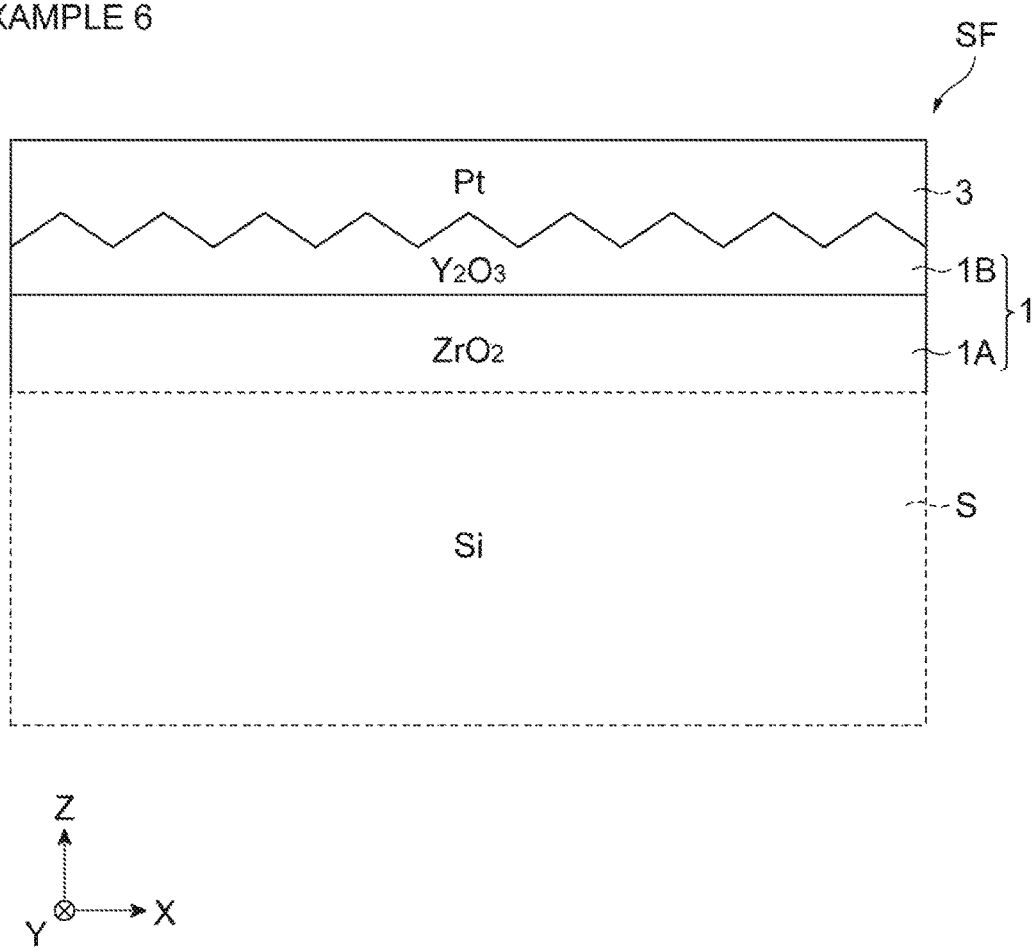
FIG. 6 is a view illustrating a longitudinal cross-sectional structure of a stacked film according to Example 6.

FIG. 6 is a view illustrating a longitudinal cross-sectional structure of a stacked film according to Example 6.

Example 6 differs from Example 2 in that PtO is removed, and is the same as in Example 2 in other respects. In this case, the Pt film 3 is formed directly on the $Y_2O_3$ film 1B.

An orientation of the respective layers in a thickness direction is Si (001)/$ZrO_2$ (001)/$Y_2O_3$ (001)/Pt (001). In other words, directions of the c axis [001] of all of the films substantially coincide, and are parallel to a film thickness direction. Further, the orientation of the respective layers in a plane of the film is Si (100)/$ZrO_2$ (100)/$Y_2O_3$ (100)/Pt (100). In other words, the directions of the a axis [100] of all the films coincide and are parallel to an in-plane direction.

(Evaluation and Results)

The Pt film was evaluated using an X-ray diffraction method. In this case, a peak having a half value width of 0.3° was observed at a position of 2θ=46.4° and no other peaks were observed. Further, it was confirmed that results of X-ray diffraction were the same in a substrate plane, and the film was uniform. This was an excellent value in comparison with a comparative example that will be described below. Accordingly, it was found that in a (001) Pt film of which an exposed surface was a (001) plane, a crystal state of the (100) plane of a face-centered cubic structure was high and constituent atoms oriented in a [100] direction were aligned. Thus, in the stacked film having the structure of Example 6, crystallinity of the Pt film was improved.

A preferred range of the parameters T1 and T1' is the same as that in Example 2, and the same effects are achieved.

Example 7

Figure 7:
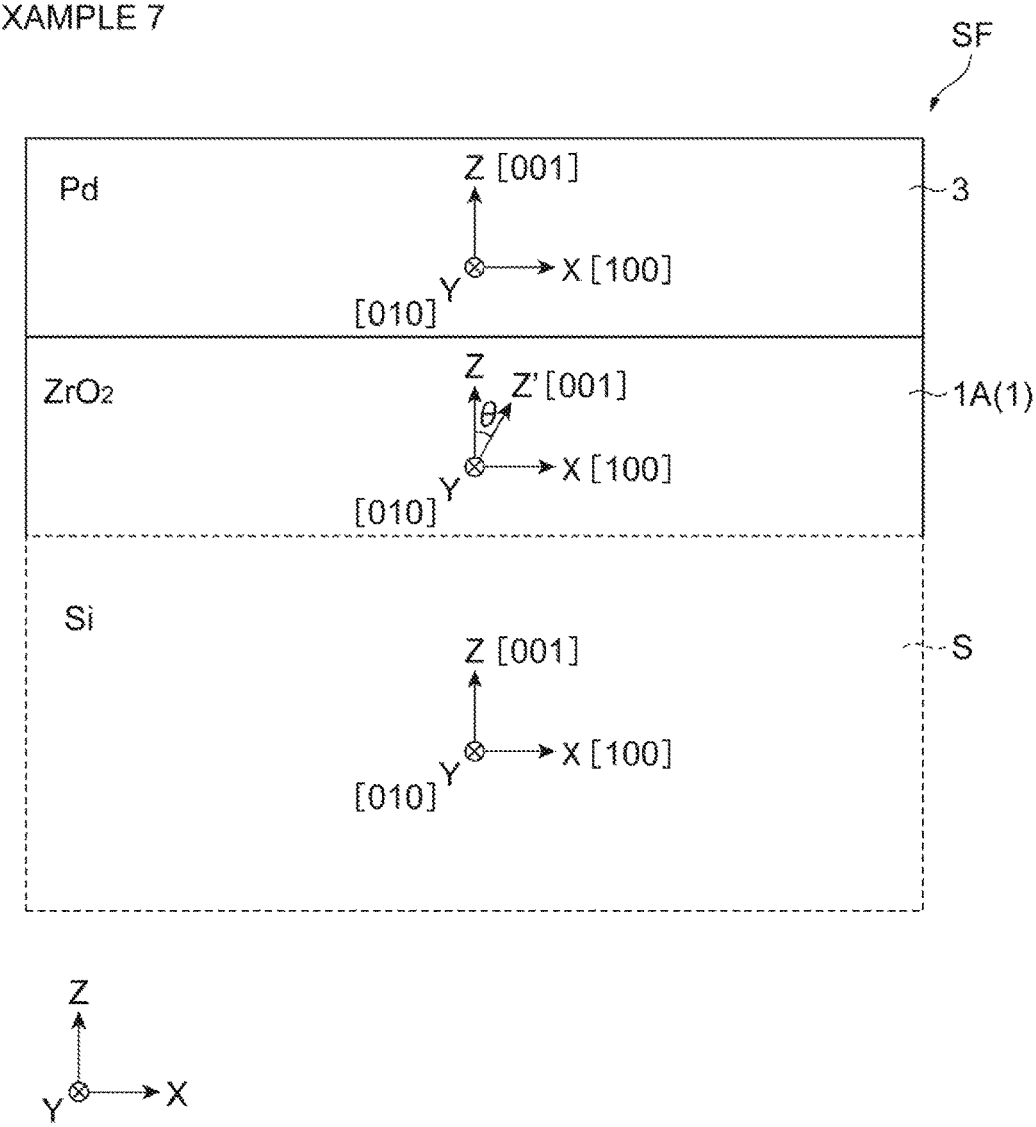
FIG. 7 is a view illustrating a longitudinal cross-sectional structure of a stacked film according to Example 7.

FIG. 7 is a view illustrating a longitudinal cross-sectional structure of a stacked film according to Example 7.

Example 7 differs from Example 3 in that PdO is removed, and is the same as in Example 3 in other respects. In this case, the Pd film 3 is formed directly on the $ZrO_2$ film 1A.

An orientation of the respective layers in a film thickness direction is Si (001)/$ZrO_2$ (001)/Pd (001). In other words, directions of the c axis [001] of all of the films substantially coincide, and are parallel to a film thickness direction. Further, the orientation of the respective layers in a plane of the film is Si (100)/$ZrO_2$ (100)/Pd (100). In other words, the directions of the a axis [100] of all the films coincide and are parallel to an in-plane direction.

(Evaluation and Results)

The Pd film was evaluated using an X-ray diffraction method. In this case, a peak having a half value width of 0.4° was observed at a position of 2θ=46.7° and no other peaks were observed. Further, it was confirmed that results of X-ray diffraction were the same in a substrate plane, and the film was uniform. This was an excellent value in comparison with a comparative example that will be described below. Accordingly, it was found that in a (001) Pd film of which an exposed surface was a (001) plane, a crystal state of the (100) plane of a face-centered cubic structure was high and constituent atoms oriented in a [100] direction were aligned. Thus, in the stacked film having the structure of Example 7, crystallinity of the Pd film was improved.

A preferred range of the parameter T1 is the same as that in Example 3, and the same effects are achieved.

Example 8

Figure 8:
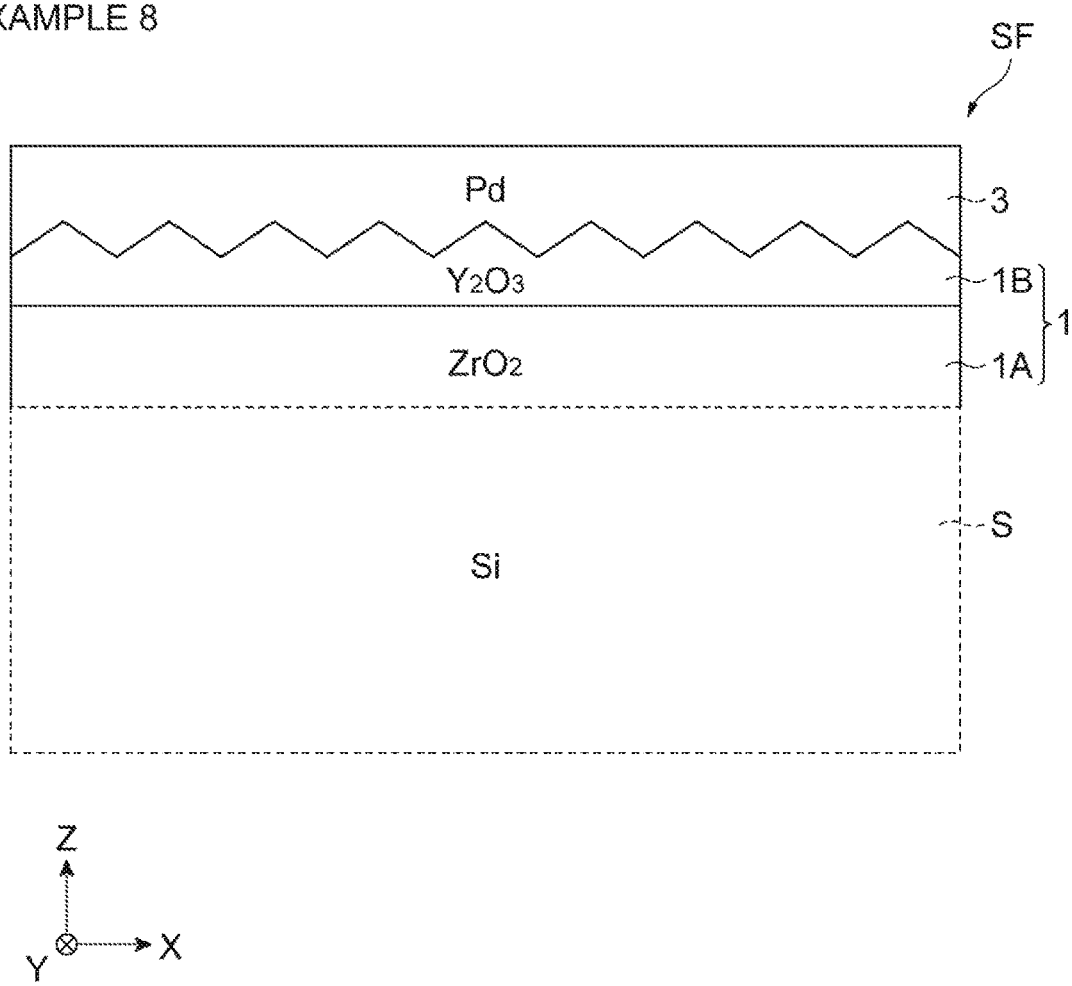
FIG. 8 is a view illustrating a longitudinal cross-sectional structure of a stacked film according to Example 8.

FIG. 8 is a view illustrating a longitudinal cross-sectional structure of a stacked film according to Example 8.

Example 8 differs from Example 4 in that PdO is removed, and is the same as in Example 4 in other respects. In this case, the Pd film 3 is formed directly on the $Y_2O_3$ film 1A.

An orientation of the respective layers in a film thickness direction is Si (001)/$ZrO_2$ (001)/$Y_2O_3$ (001)/Pd (001). In other words, directions of the c axis [001] of all of the films substantially coincide, and are parallel to a film thickness direction. Further, the orientation of the respective layers in a plane of the film is Si (100)/$ZrO_2$ (100)/$Y_2O_3$ (001)/Pd (100). In other words, the directions of the a axis [100] of all the films coincide and are parallel to an in-plane direction.

(Evaluation and Results)

The Pd film was evaluated using an X-ray diffraction method. In this case, a peak having a half value width of 0.3° was observed at a position of 2θ=46.7° and no other peaks were observed. Further, it was confirmed that results of X-ray diffraction were the same in a substrate plane, and the film was uniform. This was an excellent value in comparison with a comparative example that will be described below. Accordingly, it was found that in a (001) Pd film of which an exposed surface was a (001) plane, a crystal state of the (100) plane of a face-centered cubic structure was high and constituent atoms oriented in a [100] direction were aligned. Thus, in the stacked film having the structure of Example 8, crystallinity of the Pt film was improved.

Preferred ranges of the parameters T1 and T1' are the same as those in Example 4, and the same effects are achieved.

Comparative Example 1

Figure 9:
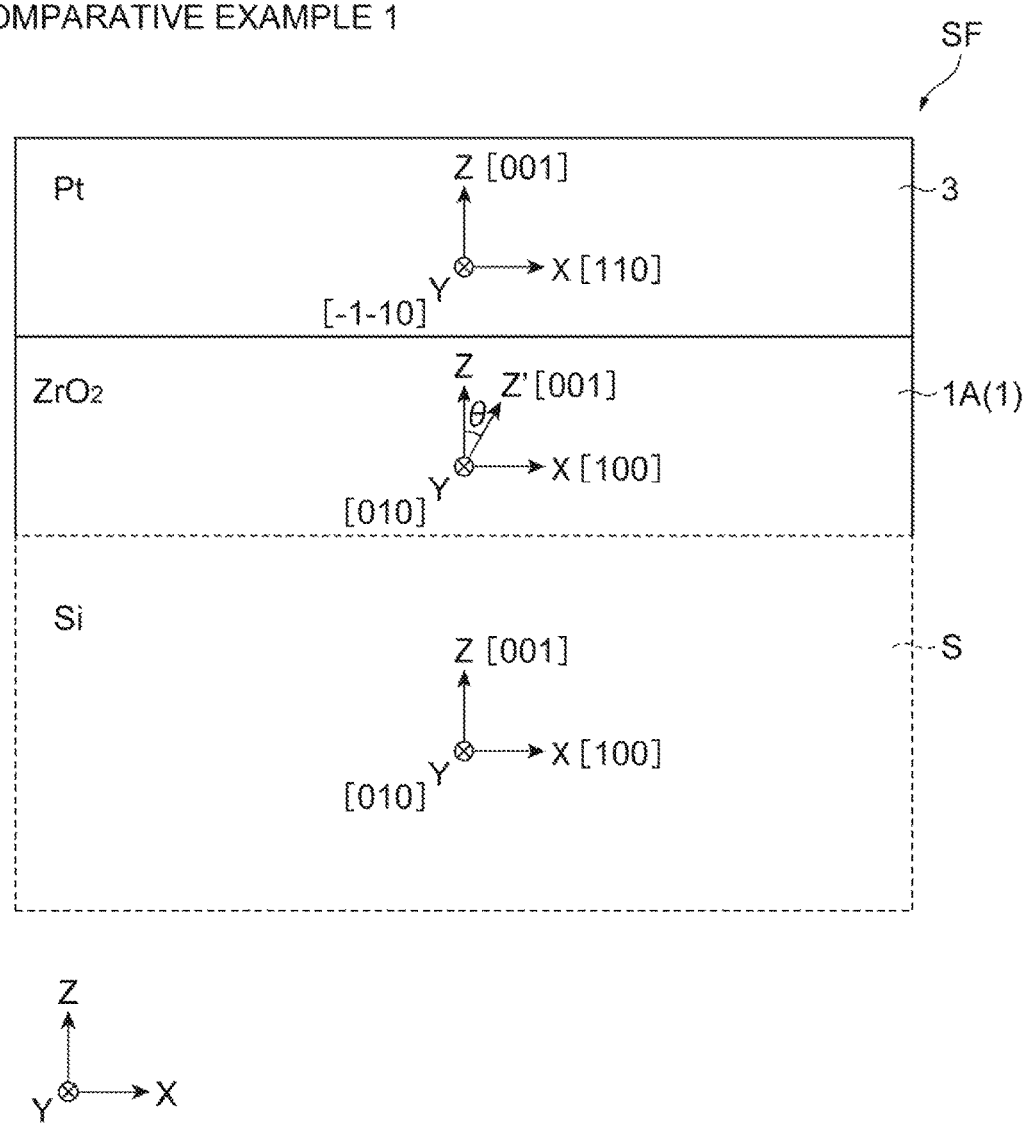
FIG. 9 is a view illustrating a longitudinal cross-sectional structure of a stacked film according to Comparative Example 1.

FIG. 9 is a view illustrating a longitudinal cross-sectional structure of a stacked film according to Comparative Example 1.

In Comparative Example 1 (FIG. 9), a structure in which a crystal axis of the Pt film is rotated by 45° about a Z axis compared to Example 5 is shown, and other details are the same as in Example 5. In Comparative Example 1, a sample in which a [100] axis of the $ZrO_2$ film and a [110] axis of the Pt film in Example 5 are parallel to each other was fabricated. This structure is obtained through fabrication in which a step of Example 1 of forming the PtO film after performing the formation of the $ZrO_2$ film is omitted, and a formation temperature of the Pt film is lower than in Example 1 at 400° C. T2 and P1 are PtO film formation conditions, and in a step of Comparative Example 1 in which the above step is omitted, the film formation conditions of the Pt film are that the Pt film formation temperature is low at about 400° C. and a rotation angle is 45°.

(Evaluation and Results)

The Pt film in Comparative Example 1 was evaluated using an X-ray diffraction method. In this case, a peak having a half value width of 0.8° was observed at a position of 2θ=46.4°. Compared with Example 5, crystallinity of the Pt film was poor. Further, a variation occurred in the crystallinity of the Pt film in the substrate surface, and a half value width of a peak of 2θ=46.4° of Pt was 0.8° in a region of about 50% of an area of a 6-inch substrate, but was greater than 0.8° and equal to or smaller than 1.5° in another region. Compared with Example 5, uniformity of crystallinity of the Pt film was poor.

Comparative Example 2

Figure 10:
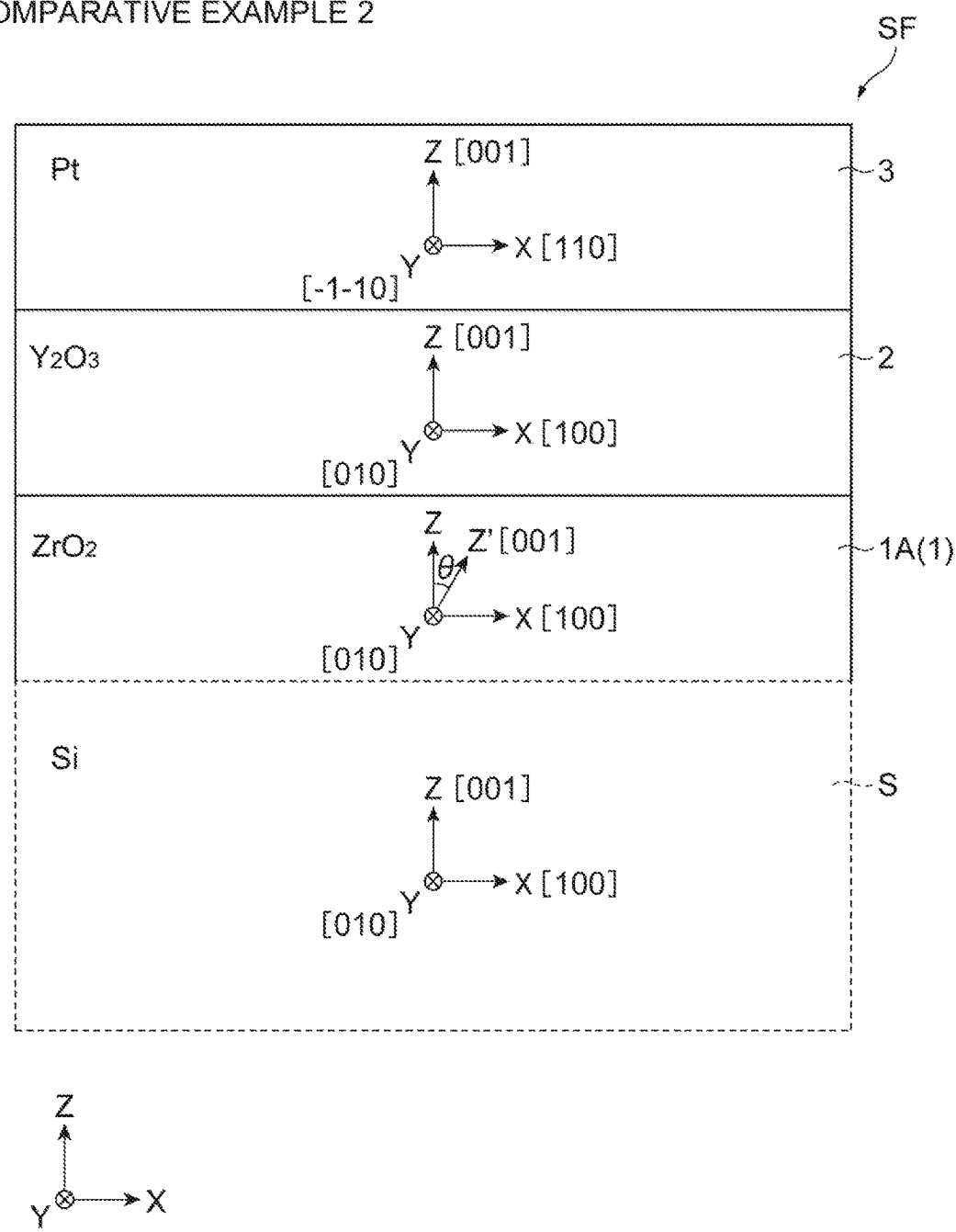
FIG. 10 is a view illustrating a longitudinal cross-sectional structure of a stacked film according to Comparative Example 2.

FIG. 10 is a view illustrating a longitudinal cross-sectional structure of a stacked film according to Comparative Example 2.

In Comparative Example 2 (FIG. 10), a structure in which a crystal axis of the Pt film is rotated by 45° about a Z axis compared to Example 1 is shown, and other details are the same as in Example 1. In Comparative Example 2, a sample in which a [100] axis of the $ZrO_2$ film and a [110] axis of the Pt film in Example 1 are parallel to each other was fabricated. This structure can be fabricated if T2 and P1 are set to 400° C. and 0.01 Pa, respectively, and a formation temperature of Pt is changed to 450° C. in Example 1.

(Evaluation and Results)

The Pt film was evaluated using an X-ray diffraction method. In this case, a peak having a half value width of 0.5° was observed at a position of 2θ=46.4° and intensity of other peaks was equal to or smaller than 1/10. Further, a variation occurred in the crystallinity of the Pt film in the substrate surface, and a half value width of a peak of 2θ=46.4° of Pt was 0.5° in a region of about 50% of an area of a 6-inch substrate, but was greater than 0.5° and equal to or smaller than 1.0° in another region. The values in Example 1 showed better crystallinity and uniformity of the Pt film.

Comparative Example 3

In Comparative Example 3, the Pd film was formed in the above-described method in place of the Pt film in Comparative Example 1.

(Evaluation and Results)

The Pd film in Comparative Example 3 was evaluated using an X-ray diffraction method. In this case, a peak having a half value width of 0.8° was observed at a position of 2θ=46.7°. Compared with Example 7, characteristics were poor in crystallinity of the Pd film. Further, a variation occurred in the crystallinity of the Pd film in the substrate surface, and a half value width of a peak of 2θ=46.7° of Pt was 0.8° in a region of about 50% of an area of a 6-inch substrate, but was greater than 0.8° and equal to or smaller than 1.5° in another region. Compared with Example 7, uniformity of crystallinity of the Pd film were poor.

Comparative Example 4

In Comparative Example 4, the Pd film was formed in the above-described method in place of the Pt film in Comparative Example 2.

(Evaluation and Results)

The Pd film in Comparative Example 4 was evaluated using an X-ray diffraction method. In this case, a peak having a half value width of 0.7° was observed at a position of 2θ=46.7°. Compared with Example 3, characteristics were poor in crystallinity of the Pd film. Further, a variation occurred in the crystallinity of the Pd film in the substrate surface, and a half value width of a peak of 2θ=46.7° of Pd was 0.7° in a region of about 50% of an area of a 6-inch substrate, but was greater than 0.7° and equal to or smaller than 1.5° in another region. Compared with Example 5, uniformity of crystallinity of the Pd film was poor.

That is, it was found that all the stacked films of Examples 1 to 8 had excellent characteristics.

The above-described stacked film and the following electronic device can be applied to various devices after the substrate S is removed, if necessary. The substrate formed of Si can be removed with, for example, an aqueous solution in which hydrofluoric acid and nitric acid are mixed. Further, the Si can be removed in a specific shape by a reactive ion etching method such as Deep-RIE and the stacked film or the electronic device can be applied to a micro-electro-mechanical system or the like.

Figure 11:
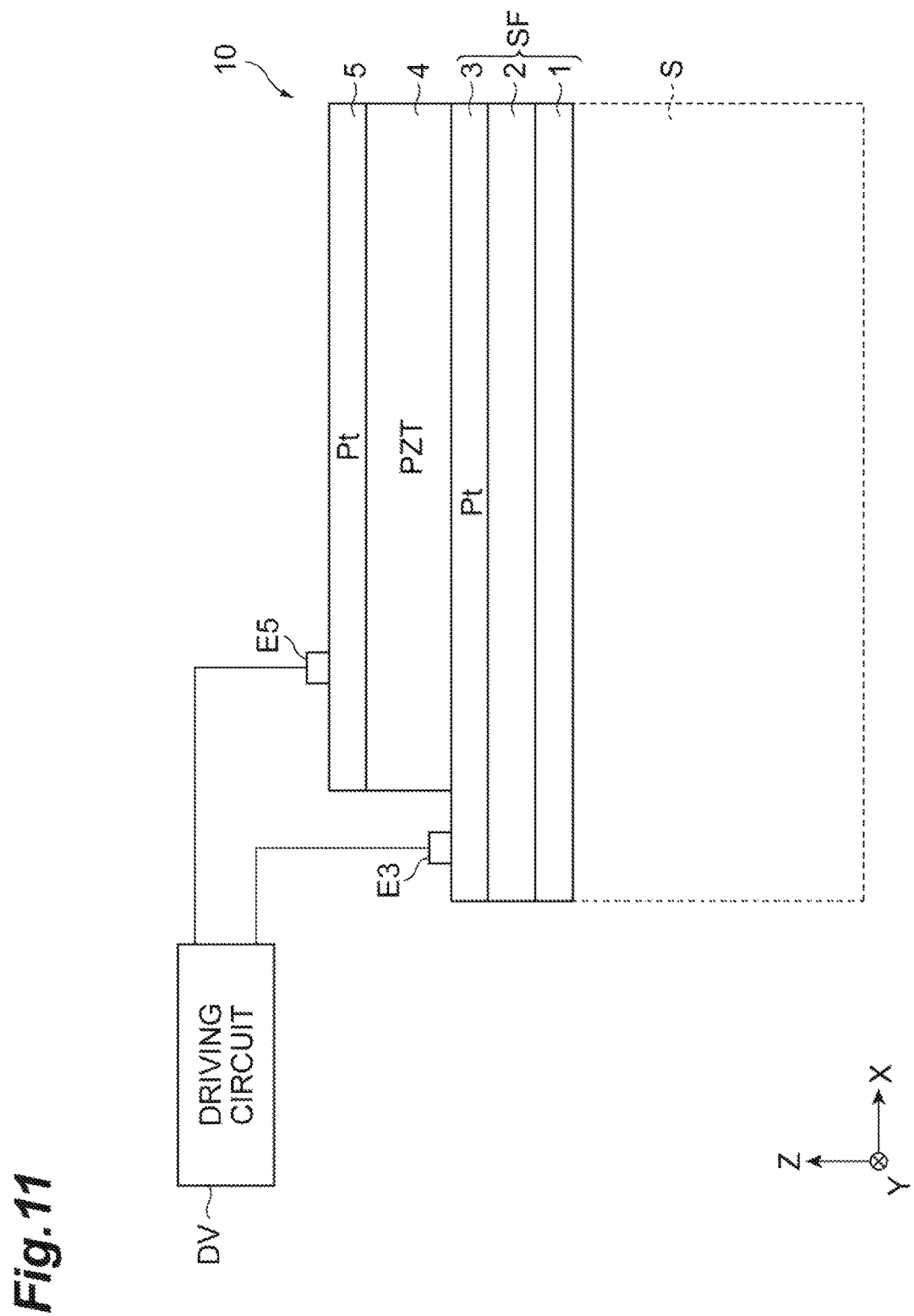
FIG. 11 is a view illustrating a longitudinal cross-sectional structure of a piezoelectric driving element (electronic device).

FIG. 11 is a view illustrating a longitudinal cross-sectional structure of the piezoelectric driving element (electronic device).

If the stacked film illustrated in FIGS. 1 to 8 is a stacked film SF, a piezoelectric film 4 is formed on the predetermined metal film 3 located on a surface of the stacked film SF in the piezoelectric driving element, and an upper electrode film 5 is formed on the piezoelectric film 4. In this example, the piezoelectric film 4 is formed of lead zirconate titanate (PZT), and the upper electrode 5 is formed of a Pt film. As the piezoelectric film, a material having a perovskite crystal structure is preferable, and a material such as lead titanate, lead zirconate, barium titanate, or potassium niobate is used, in addition to PZT. As a material of the upper electrode 5, various metal materials such as Al or Cu can be used as long as the materials are materials that are conductive to the piezoelectric film.

Structurally, in the piezoelectric driving element 10 formed of the stacked structure illustrated in FIG. 11, a potential application terminal E3 for applying a potential is electrically connected to the predetermined metal film 3 of the stacked film SF. A potential application terminal E5 for applying a potential to an upper electrode 5 is electrically connected to the upper electrode 5. These can be electrode pads or bonding pads and come in contact with respective electrodes.

A voltage from a driving circuit DV is applied between the potential application terminal E3 (the predetermined metal film 3 that is the lower electrode) and the potential application terminal E5 (the upper electrode 5), and if a voltage is applied in the thickness direction of the piezoelectric film 4, the piezoelectric film 4 is expanded, contracted, and deformed, and functions as an actuator. Thus, a potential necessary for driving of the electronic device is applied to the Pt film of the stacked film, which can contribute to an operation of the electronic device. In this example, the stacked film further includes a piezoelectric film provided on the Pt film, and when the piezoelectric film 4 is formed on the predetermined metal film 3 with high crystallinity, crystallinity of the piezoelectric film also becomes high, and therefore characteristics thereof are improved. That is, excellent characteristics such as an increase in the driving force due to the piezoelectric film 4 or a reduction in leakage current can be exhibited.

Figure 12:
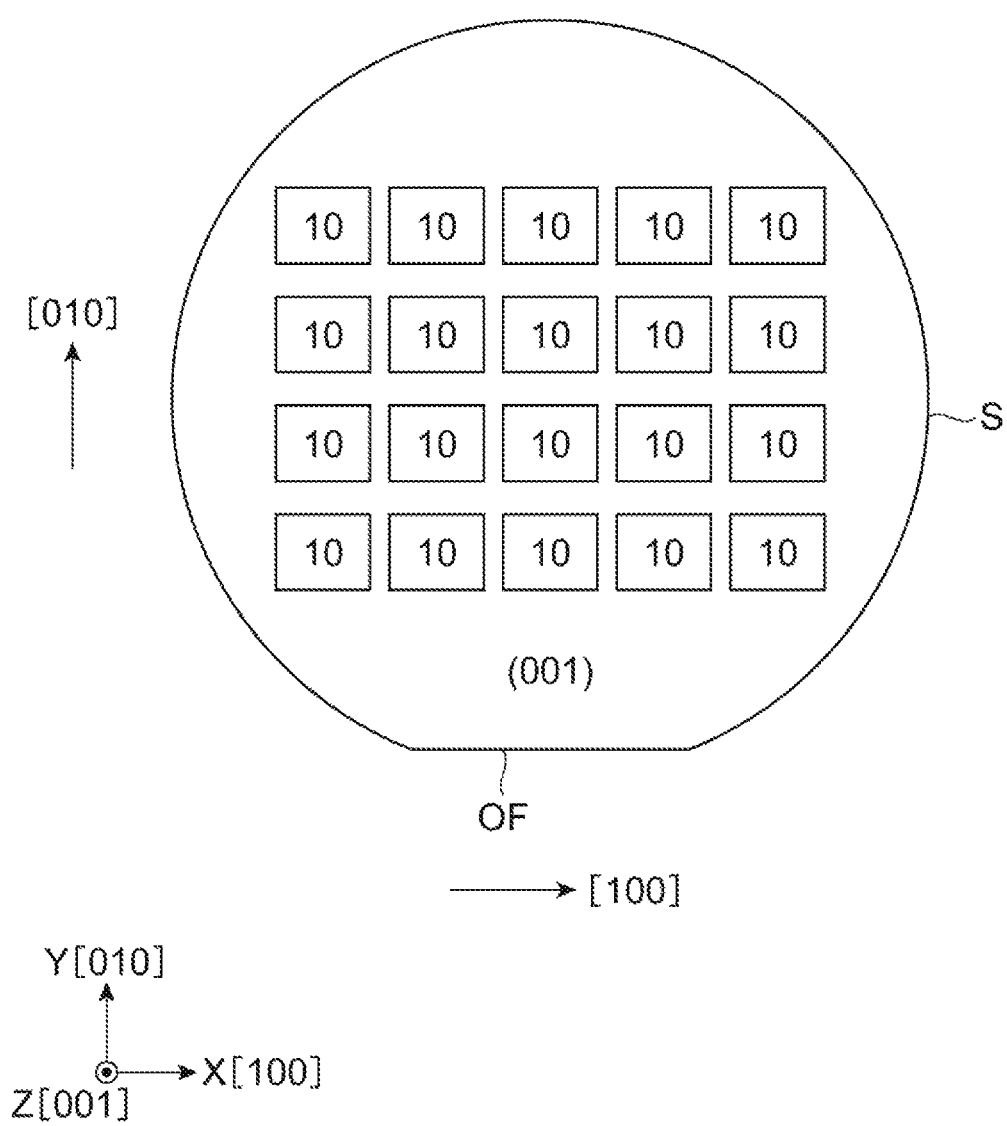
FIG. 12 is a plan view of an electronic device substrate including a plurality of piezoelectric driving elements 10.

FIG. 12 is a plan view of an electronic device substrate including a plurality of piezoelectric driving elements 10.

In the electronic device substrate, a wafer is used as the substrate S, and the above-described stacked film (the piezoelectric driving element 10) is provided on the wafer having a size equal to or greater than 6 inches. A plurality of piezoelectric driving elements 10 can be separated by dicing. When the stacked film (the piezoelectric driving element 10) is formed on a wafer having a large diameter, mass productivity is excellent since a plurality of elements can be formed in the same process. In addition to the piezoelectric driving element, a piezoelectric element such as a sensor element or a memory element can be fabricated using the present electronic device substrate.

By providing PtO, an electrode film with a good (100) orientation is obtained uniformly on a semiconductor substrate having a large diameter. The large diameter is a size in which a diameter is about 150 mm or more, which is generally used in a current MEMS process. Usually, a 6 inch (150 mm) substrate or an 8 inch (200 mm) substrate is used, and a large-area substrate having a diameter of 6 inches or more can be suitably used. An area of a circular substrate having a diameter of 6 inches is about 17600 mm$^2$, and a substrate equal to or larger than this area can be used. Accordingly, mass production can be efficiently performed, and devices with uniform performance can be fabricated in a large quantity at a low cost.

In this example, a (001) Si wafer was used as the substrate S. A longitudinal direction of an orientation flat OF of the wafer is a [100] direction, and the rectangular piezoelectric driving elements 10 are aligned in a matrix form in a plan view. Another [110] is generally used as a direction of the orientation flat, and a relationship between the direction and an arrangement of the orientation flat and the piezoelectric element formed on the substrate is not particularly defined, and can be appropriately set according to an application or a design.

Next, an electronic device including the above-described piezoelectric driving element will be described.

Figure 13:
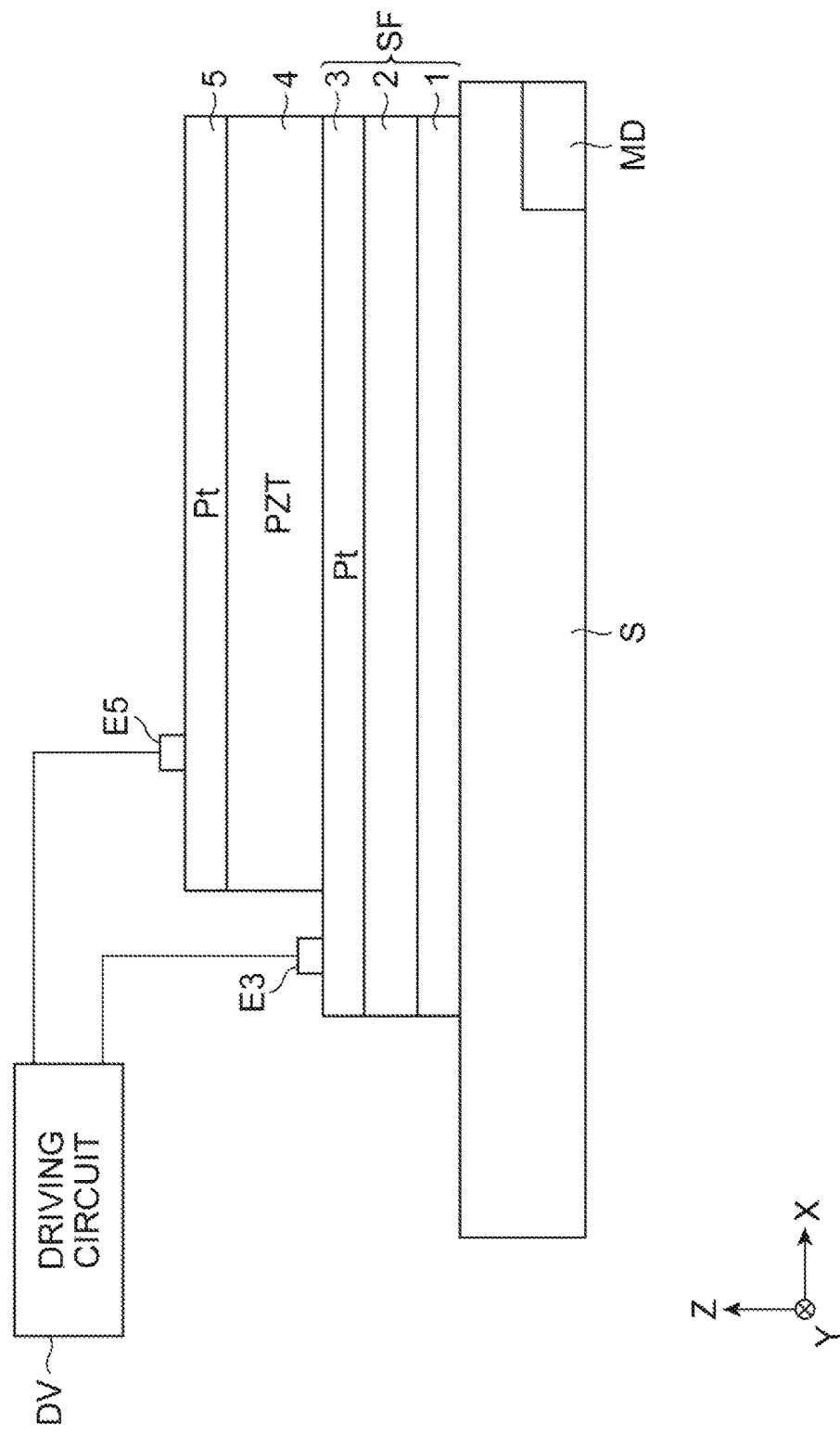
FIG. 13 is a view illustrating a longitudinal cross-sectional structure of a magnetic head (electronic device) including a piezoelectric driving element.

FIG. 13 is a view illustrating a longitudinal cross-sectional structure of a magnetic head (electronic device) including a piezoelectric driving element.

A substrate S is a slider formed of AlTiC, and the stacked film SF, the piezoelectric film 4, and the upper electrode 5 described above are formed on the substrate S. That is, a piezoelectric driving element is formed on a Si substrate, the Si substrate is removed, and then the piezoelectric driving element is bonded to an AlTiC substrate. The bonding includes a method of using an adhesive and a method of using thermal fusion. A magnetoresistive effect element MD for data reading is provided in a distal end portion of the substrate S. A coil for data writing is provided near the magnetoresistive effect element MD.

If a voltage is applied to the driving circuit DV, the slider is slightly deformed and a position of the magnetoresistive effect element MD is moved. For example, the magnetoresistive effect element MD is slightly moved in a Z-axis direction. This example is only an example, and movement in several directions, including rotation, can be performed according to an arrangement direction of the piezoelectric driving element or the number of piezoelectric driving elements.

Figure 14:
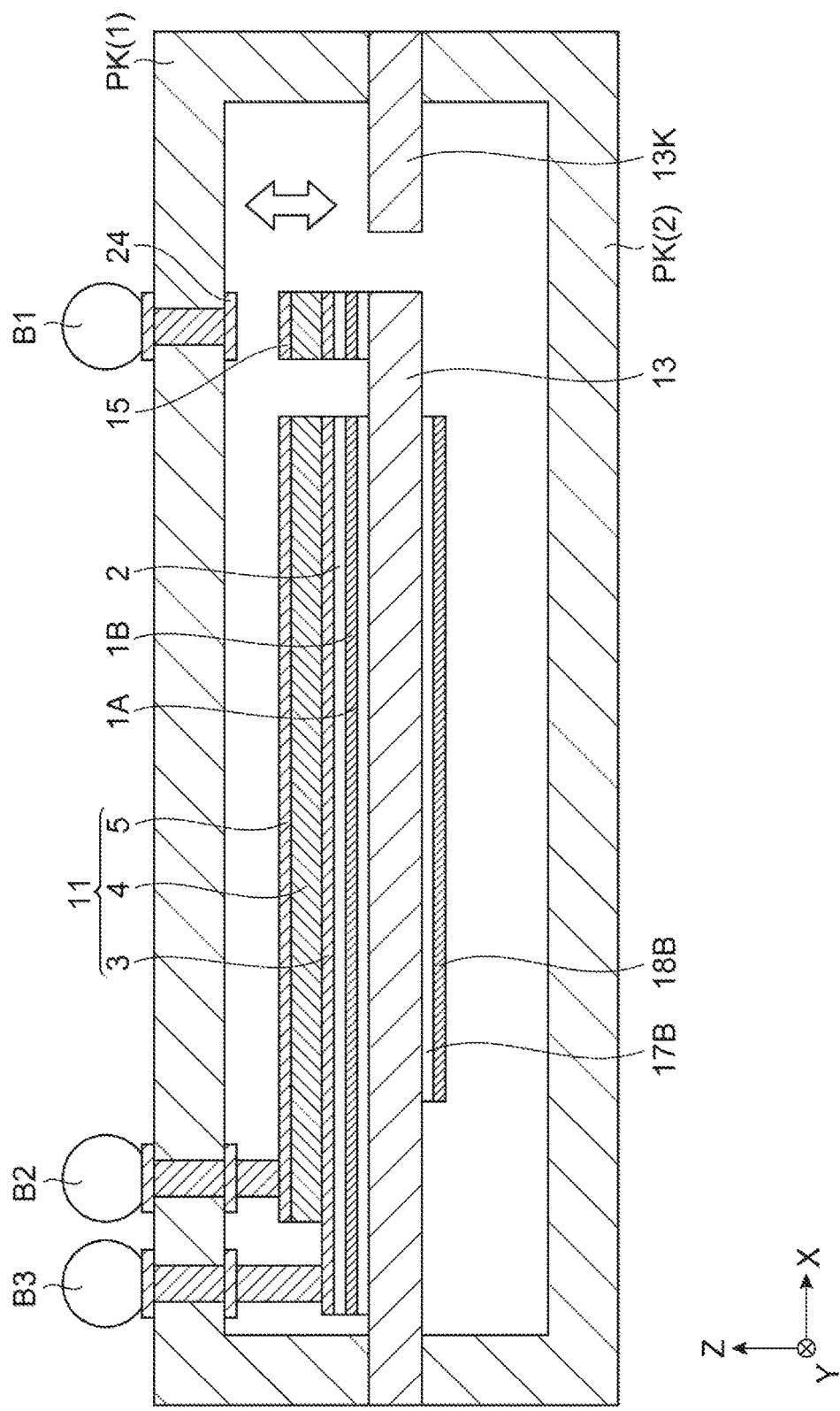
FIG. 14 is a view illustrating a longitudinal cross-sectional structure of an MEMS switch (electronic device) including a piezoelectric driving element.

FIG. 14 is a view illustrating a longitudinal cross-sectional structure of an MEMS switch (electronic device) including a piezoelectric driving element. FIG. 15 is a plan view of a fabricated MEMS switch (a package is omitted), and a cross-section taken along line A-A corresponds to FIG. 14. In this example, the structure of Example 2 is applied. Of course, the structures of the other embodiments can also be applied. A beam 13 in FIG. 15 is a part of a substrate 13K including the same, and a region (peripheral region) outside a two-dot chain line P of the substrate 13K is sandwiched by a first member PK(1) and a second member PK(2) constituting the package.

The first member PK(1) and the second member PK(2) are rectangular members having a housing space, and the peripheral region of the substrate 13K is sandwiched and held between opening end surfaces thereof. Thus, the beam 13 can be bent in the housing space. The beam 13 contains Si.

The oxide film 1 formed of the $ZrO_2$ film 1A and the $Y_2O_3$ film 1B, the metal oxide film 2 formed of PtO, and a lower electrode layer including the predetermined metal film 3, the piezoelectric film 4 formed of PZT, and the upper electrode 5 formed of Pt are sequentially stacked on the beam 13, resulting in a contact terminal structure. A stacked body including a contact terminal 15 as a surface is formed in the same stacked structure as the contact terminal structure in a distal end portion of the contact terminal structure. That is, the contact terminal 15 corresponds to the upper electrode 5. This contact terminal structure and the driving element 11 are electrically isolated. Bump electrodes B1, B2, and B3 are provided on an outer surface of the package.

The bump electrode B2 is electrically connected to the upper electrode 5, and the bump electrode B3 is electrically connected to the predetermined metal film 3 that is the lower electrode. Therefore, a voltage is applied from the driving circuit DV using the bump electrodes as potential application terminals. The piezoelectric film 4 is contracted by a signal applied from the driving circuit to the lower electrode including the predetermined metal film 3 and the upper electrode 5, thereby bending the beam body. When the beam is bent, the contact terminal 15 comes in contact with a second signal line 24 (a facing electrode) at a position facing the contact terminal 15. A state in which a signal circuit connected to the contact terminal 15 via a first signal line 14 and the second signal line 24 are electrically connected via the bump electrode B1 and the switch is turned on is obtained by such contact. That is, an input terminal IN, the first signal line 14, the second signal line 24, and an output terminal OUT are electrically connected.

A back surface insulating layer 17B and a metal film 18B are provided on the back surface side of the beam 13. As the back surface insulating layer 17B, an oxide film containing an element such as Y, Zr, or Si can be suitably used. As a material of the metal film 18B, conductive materials Cu, Mo, Al, Ni, Ti, Pt, W, Cr, Ta, Ru, Sr, Ir, or an alloy containing two or more of these elements can be suitably used.

An orientation and a lattice constant of the above-described PtO film can be specified by not only the above-described X-ray diffraction method, but also a transmission electron microscope. It was confirmed by such a method that the PtO film of Examples 1 to 5 described above has a NaCl type structure (001) oriented film having a lattice constant of 0.51 nm. Further, it is preferable that the lattice constant of the metal oxide film 2 be 0.5 to 0.55 nm, and the metal oxide film 2 have a NaCl type structure.

As described above, the above-described stacked film can be applied to a micro-electro-mechanical system (MEMS) such as an actuator or a sensor in which a piezoelectric thin film such as PZT is formed with an electrode film on a semiconductor substrate such as silicon, and the thin film or the semiconductor substrate are processed.

Further, in the above-described embodiment, in the MEMS product using the piezoelectric film, characteristics thereof are improved since an orientation of the crystal of the piezoelectric film is controlled in a specific direction. Specifically, in the piezoelectric MEMS using PZT, a (001) plane of the PZT is aligned to be parallel to a direction of an electric field formed between the upper and lower electrodes (is said to be (001) oriented in a thickness direction of the film), resulting in excellent piezoelectric characteristics.

Therefore, an orientation direction of the electrode film serving as a base that forms the piezoelectric film such as PZT is important. Generally, Pt is used for a base of a perovskite piezoelectric thin film such as PZT. In this case, the (001) plane of the face-centered cubic structure of the Pt film is parallel to the substrate surface, that is, (001) oriented, making it possible to obtain a (001) oriented PZT film with good characteristics.

In the above-described example, a structure having $PtO_2$ as an intermediate layer can be considered. However, with this structure, it is difficult to stably obtain a good Pt (001) oriented film in comparison with use of PtO. It is conceivable that since the crystal of $PtO_2$ has a lattice constant of 0.41 nm and is greatly different from a lattice constant (0.52 nm) of the $ZrO_2$ film serving as the base, the (001) oriented Pt film cannot be stably grown due to less influence of the $PtO_2$ crystal serving as the base at the time of crystal growth. When each a axis is shifted by 45° in the plane, a deviation of a length between respective crystals is small, but in this case, since there may be two types of orientations in the plane, it is preferable to use the PtO or PdO film. Further, as can be seen from the results of the above-described example, even when the Pt film or the Pd film is directly formed on the $ZrO_2$ and $Y_2O_3$ film without using the PtO or PdO film, a metal film with good crystallinity can be obtained by causing a [100] axis of the $ZrO_2$ film and a [100] axis of the metal film to coincide.

Further, a semiconductor substrate can be used as the material of the substrate S. The most preferable example is a case in which Si is used. Gallium arsenide, gallium nitride, gallium oxide, silicon carbide, and the like are known as semiconductors. Si is inexpensive. A process of forming a semiconductor circuit such as a CMOS is established for Si. Si is suitable as a structural material of a micro electro mechanical system called an MEMS, and is applicable to various electronic devices. A high-performance piezoelectric MEMS device, ferroelectric memory, or the like can be realized by forming a functional film such as a piezoelectric film or a ferroelectric film on the Si substrate.

A single-oriented film is a film that is formed with only a certain specific crystal plane aligned in a thickness direction of the substrate (in a direction perpendicular to the substrate surface). Similarly, a state in which the film is formed with only a certain specific crystal plane aligned in the thickness direction of the substrate is referred to as single-oriented. For example, in a Pt (001) single-oriented film, since a crystal structure of Pt is a cubic crystal face-centered cubic structure at room temperature, the (001) plane of the face-centered cubic structure is formed in parallel to the film plane. Whether the film is single-oriented can be investigated using an analytical method such as an X-ray diffraction method, a transmission electron microscope, or electron beam diffraction. For example, when θ-2θ scan of the X-ray diffraction method is performed, a peak of a surface equivalent to one surface in the single-oriented film is strongly observed, and peaks of other surfaces are not observed or have an intensity of 1/10 or less. In the Pt (001) single-oriented film, a peak of (00N) (N is an integer) is observed, and peaks of (NN0), (NNN), or the like are not observed or have an intensity of 1/10 or less.

Further, an epitaxial film refers to a film formed to be generally aligned in a specific direction together with a direction (referred to as an in-plane direction) in which the direction of the crystal of the film is parallel to the film plane and a direction (referred to as the orthogonal direction) perpendicular to the film surface in a crystal direction of an underlying layer. A $ZrO_2$ (001) epitaxial film formed on an Si (001) substrate will be described by way of example. $ZrO_2$ has a crystal structure of a monoclinic crystal at room temperature, and an a axis (referred to as a [100] direction) and a b axis (referred to as a [010] direction) of the unit lattice are orthogonal. For the two axes, a c axis (a [001] direction) is at an angle slightly deviating from 90° with respect to the a axis (a stable angle in the absence of constraints of a substrate or the like is about 99.2°). A unit length of each axis is about 0.52 nm. $ZrO_2$ of the monoclinic crystal at room temperature is a cubic crystal or a tetragonal crystal in which the a axis, the b axis, and the c axis are orthogonal to each other at a high temperature and each length is substantially the same. In the $ZrO_2$ (001) epitaxial film on the Si (001) substrate, an orientation direction of the crystal is aligned so that the c axis of $ZrO_2$ is directed in a direction perpendicular to the film surface, and the [100] axis in the Si plane is aligned parallel to the a axis [100] or the b axis [010] of $ZrO_2$.

In a crystal structure other than the cubic crystal, the planes or the directions are generally required to be distinguished since the planes or the directions are not equivalent, but the crystal structure can be treated as being the same as all cubic crystals, including a tetragonal crystal, a monoclinic crystal, an orthorhombic crystal, or the like, and regarded as being equivalent. That is, regardless of the crystal structure, a (100) plane can collectively indicate (100), (010), and (001) planes and a [100] direction can collectively indicate [100], [010], and [001] directions, but if the predetermined metal film 3 (the Pt film or the Pd film) is single-oriented along the a axis [100] of the film surface, a PZT crystal is single-oriented in a c axis [001] direction (thickness direction) in a direction perpendicular to the film surface and grown. Further, an electric field in the PZT crystal is applied in the thickness direction.

The oxide film may be a single layer, or may be a stack of a plurality of oxide films. It has been described above that the $ZrO_2$ layer is formed and the $Y_2O_3$ layer is formed on the $ZrO_2$ layer, but a structure of three or more layers can be allowed. Further, the oxide film can be a layer containing a plurality of metal elements or a layer in which a component thereof continuously changes in the thickness direction.

A (001) single-oriented metal thin film (Pt film) is formed on the oxide film via a metal oxide layer formed of a suboxide such as PtO. It is preferable for the metal thin film to be a material having a crystal structure of a face-centered cubic structure at room temperature. A metal thin film of a hexagonal crystal system can also be used, but a (001) oriented metal thin film of which the orientation direction is aligned more uniformly can be obtained by using a metal thin film of a cubic crystal system.

It is preferable for the above-described metal oxide film 2 to have a NaCl type crystal structure. In the NaCl type structure, metal atoms are arranged at the same position as the face-centered cubic structure, and oxygen atoms are arranged at a center of each ridge side of the cube thereof. Since a position of the metal atoms in the NaCl type structure and a position of the metal atom of the face-centered cubic structure are the same position in the unit lattice, crystals thereof are stacked, thus enabling crystal growth with high matching and resulting in a good single-oriented film.

It is conceivable that it is preferable for the metal oxide film to have an intermediate lattice constant between a lattice constant of the underlying oxide thin film and a lattice constant of the metal thin film formed on the upper side. Since the lattice constant of $ZrO_2$ is about 0.52 nm and the lattice constant of Pt is about 0.4 nm, PtO of which a lattice constant between them is about 0.51 nm is preferable. This can be considered as one factor contributing to easy alignment of the orientation in the plane of each stacked film.

The metal oxide film can be formed by supplying an oxidizing substance such as oxygen gas, oxygen plasma, or ozone before the metal thin film is formed. The metal oxide film can also be formed by supplying the oxidizing substance for a certain time in an initial step in which the metal oxide film is formed. A method of forming each thin film described above is not particularly limited, and a vacuum film formation method such as a vacuum deposition method or a sputtering method, a chemical solution method of applying a raw material solution to a substrate and performing firing, or the like can be used.

The thickness of the metal oxide film is not particularly limited, but is usually 0.5 to 50 nm. When this thickness is a value below this range, it is difficult to obtain the Pt film or the Pd film with high crystallinity. Further, when the thickness is a value above this range, a crystal of $PtO_2$ or $PdO_2$ is likely to be mixed, making it difficult to obtain a uniform film.

PZT (Pb(Zr, Ti)$O_3$) is preferable as a piezoelectric ceramic that can be used as the piezoelectric film, but has a perovskite structure. When a material of the perovskite structure is expressed as $ABO_3$, Pb, Ba, Sr, Ca, K, Na, Li, or the like can be used as the element of A, and an element such as Ti, Zr, Mn, Nb, or Ru can be used as B. Some of these elements may be replaced with A and B. Further, although $ABO_3$ is used, a ratio of elements is not necessarily exactly this ratio, and may deviate in view of electrical characteristics such as piezoelectric characteristics or reliability.

Further, a protective film or another functional film can be stacked on a functional film having the above-described function. As a material of the conductive film such as an upper electrode, an oxide conductive film such as $SrRuO_3$ or $LaNiO_3$, or a metal film (also including an alloy) such as Pt, Ni, or Fe may be used. Another film may also be formed between layers as necessary. Further, a resin film or an insulating film may be formed as a protective film on the above film.

Further, an electronic device having excellent electrical characteristics can be fabricated using the substrate for an electronic device. An MEMS component such as a micro-actuator or a sensor, a storage device such as a ferroelectric memory, or an optical functional component such as an optical modulator can be obtained by performing a patterning process on the stacked film to have a required shape using etching or the like or by etching a semiconductor substrate using a reactive ion etching method. The above-described stacked film can be applied to a variety of devices such as a power generation device, a tactile sensor, a pressure sensor, a microphone, an acceleration sensor, an angular velocity sensor, or an RF switch.

Examples in which the PtO film or the PdO film is used as the metal oxide film 2, and the Pt film or the Pd film is used as the predetermined metal film 3 have been described above. When a ratio of the oxygen contained in the metal oxide film is reduced, the film becomes the metal film included therein. Accordingly, it is conceivable that when the predetermined metal film 3 contains a metal contained in the metal oxide film serving as a base, this becomes a cause of formation of a good crystal since there is continuity of the same kind of metallic elements in the thickness direction.

It is conceivable that the same effects can be obtained even when another metal is contained in the same kind of metal, in addition to the use of the same kind of metal as the predetermined metal film 3.

For example, it is conceivable that since Au (atomic number 79) is located next to Pt (atomic number 78) in the periodic table, Au has a similar number of protons, and a AuPt film can be used in place of the Pt film, and it is conceivable that even when a AuPt film having a Pt film as a base or another metal film having a Pt film as a base is formed, the same effects are obtained since crystallinity of the base is good.

Further, it is conceivable that since Ag (atomic number 47) is located next to Pd (atomic number 46) in the periodic table, Ag has a similar number of protons, and a Ag film can be used in place of the Pd film, and it is conceivable that even when a AgPd film having a Pd film as a base or another metal film having a Pd film as a base is formed, the same effects are obtained since crystallinity of the base is good.

Since Au is located immediately to the right of Pt and Ir is located immediately to the left of Pt in the periodic table, it is conceivable that the same effects are obtained even when an alloy of at least one selected from Pt, Au, and Ir or an alloy of two or more kinds selected from them is used as another metal film. Similarly, it is conceivable that since Ag is located immediately to the right of Pd and Rh is located immediately to the left of Pd in the periodic table, the same effects are obtained even when an alloy of at least one selected from Pd, Ag, and Rh or an alloy of two or more kinds selected from them is used as another metal film.

A method of fabricating any one of the above-described stacked films includes forming the oxide film including a $ZrO_2$ film, and forming the predetermined metal film containing Pt or Pd on the oxide film in a state in which supply of oxygen into a chamber is stopped. With this fabrication method, it is possible to easily fabricate the above-described stacked film. As described above, the above-described stacked film is a stacked film including the oxide film, and the metal film provided on the oxide film, in which the oxide film includes the $ZrO_2$ film of which the main surface is a (001) plane, the metal film includes the Pt film or the Pd film that has a single orientation and of which a main surface is a (001) plane, an axis shifted about 9.2° from the [001] axis of the $ZrO_2$ film is parallel to the [001] axis of the metal film, the [100] axis of the $ZrO_2$ film and the [100] axis of the metal film are parallel to an interface between the oxide film and the metal film, and the axes of both are parallel to each other.

What is claimed is:

1. A stacked film, comprising:
   an oxide film including a $ZrO_2$ film of which a main surface is a (001) plane; and
   a metal film provided on the oxide film, the metal film including a Pt film or a Pd film that has a single orientation and of which a main surface is a (001) plane,
   wherein
   a [100] axis of the $ZrO_2$ film and a [100] axis of the metal film are parallel to each other and are parallel to an interface between the oxide film and the metal film, and
   an axis shifted by about 9.2° from a [001] axis of the $ZrO_2$ film is parallel to a [001] axis of the metal film.

2. The stacked film according to claim 1, wherein the oxide film includes
   a first oxide film including the $ZrO_2$ film; and
   a second oxide film including a metal oxide film containing a metal contained in the metal film and interposed between the first oxide film and the metal film.

3. The stacked film according to claim 2, wherein the first oxide film includes
   the $ZrO_2$ film; and
   an $Y_2O_3$ film interposed between the $ZrO_2$ film and the second oxide film.

4. The stacked film according to claim 1, further comprising:
   a piezoelectric film provided on the metal film.

5. An electronic device substrate comprising the stacked film according to claim 1 provided on a wafer having a size equal to or greater than 6 inches.

6. An electronic device comprising
   the stacked film according to claim 1; and
   a potential application terminal for applying a potential that is electrically connected to the metal film of the stacked film.

7. A method of fabricating the stacked film according to claim 1, comprising:
   forming the oxide film including the $ZrO_2$ film; and
   forming the metal film containing the Pt film or the Pd film on the oxide film in a state in which supply of oxygen into a chamber is stopped.

* * * * *